(12) United States Patent
Yamaki et al.

(10) Patent No.: US 11,093,173 B2
(45) Date of Patent: Aug. 17, 2021

(54) MEMORY SYSTEM

(71) Applicant: Kioxia Corporation, Minato-ku (JP)

(72) Inventors: Ryo Yamaki, Yokohama (JP); Gibeom Park, Yokohama (JP); Youyang Ng, Yokohama (JP); Koji Horisaki, Yokohama (JP); Kazuhisa Horiuchi, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/790,807

(22) Filed: Feb. 14, 2020

(65) Prior Publication Data

US 2021/0089232 A1    Mar. 25, 2021

(30) Foreign Application Priority Data

Sep. 19, 2019   (JP) .............................. JP2019-170544

(51) Int. Cl.
*G06F 3/06* (2006.01)
*G06F 11/10* (2006.01)
*G11C 16/26* (2006.01)
*G11C 11/56* (2006.01)
*G11C 16/10* (2006.01)
*G11C 16/04* (2006.01)

(52) U.S. Cl.
CPC .......... *G06F 3/0659* (2013.01); *G06F 3/0604* (2013.01); *G06F 3/0679* (2013.01); *G06F 11/1068* (2013.01); *G11C 11/5642* (2013.01); *G11C 16/10* (2013.01); *G11C 16/26* (2013.01); *G11C 16/0483* (2013.01)

(58) Field of Classification Search
CPC .. G06F 3/0659; G06F 11/1068; G06F 3/0604; G06F 3/0679; G11C 16/0483; G11C 16/26; G11C 11/5642; G11C 16/10
See application file for complete search history.

(56) References Cited

U.S. PATENT DOCUMENTS

| 9,711,231 | B1 | 7/2017 | Yip et al. | |
|---|---|---|---|---|
| 9,859,011 | B1 | 1/2018 | Konno et al. | |
| 2012/0096323 | A1* | 4/2012 | Tachibana | G11C 29/06 714/719 |
| 2017/0236593 | A1* | 8/2017 | Matsunaga | G06F 3/0679 714/764 |
| 2018/0076829 | A1* | 3/2018 | Ueki | G11C 7/1006 |
| 2018/0277227 | A1 | 9/2018 | Takizawa et al. | |
| 2020/0285419 | A1* | 9/2020 | Ng | G06N 3/0481 |

FOREIGN PATENT DOCUMENTS

| JP | 2018-028956 A | 2/2018 |
|---|---|---|
| JP | 2018-163707 A | 10/2018 |

* cited by examiner

*Primary Examiner* — Guy J Lamarre
(74) *Attorney, Agent, or Firm* — Oblon, McClelland, Maier & Neustadt, L.L.P.

(57) ABSTRACT

According to one embodiment, in a memory system, a memory controller is configured to execute a first operation of observing an optimum value of a read voltage and updating a set value based on the observation result of the optimum value, at a predetermined time point of a plurality of time points for updating the set value of the read voltage for a plurality of memory cells, and execute a second operation of updating the set value based on the set value updated at one previous time point without executing the observation of the optimum value, at a time point after one time point of the predetermined time point.

19 Claims, 16 Drawing Sheets

MEMORY SYSTEM

CROSS-REFERENCE TO RELATED APPLICATIONS

This application is based upon and claims the benefit of priority from Japanese Patent Application No. 2019-170544, filed Sep. 19, 2019; the entire contents of which are incorporated herein by reference.

FIELD

Embodiments described herein relate generally to a memory system.

BACKGROUND

Conventionally, memory systems having nonvolatile memory cells are known. In a NAND flash memory, a plurality of data values stored in the memory cell are made to correspond to a plurality of regions of a threshold voltage, respectively, and charges are injected so that the threshold voltage of the memory cell becomes a region corresponding to the stored data value. At the time of reading, the data value stored in the memory cell can be obtained by determining in which region the threshold voltage of the memory cell exists.

DETAILED DESCRIPTION

In general, according to one embodiment, a memory system includes a plurality of memory cells and a memory controller. The memory controller is configured to update a set value of a read voltage for the plurality of memory cells at a plurality of time points. The memory controller is configured to execute a first operation of observing an optimum value of the read voltage and updating the set value based on the observation result of the optimum value, at a predetermined time point of the plurality of time points. The memory controller is configured to execute a second operation of updating the set value based on the set value updated at one previous time point without executing the observation of the optimum value at a time point after one time point of the predetermined time point of the plurality of time points.

Exemplary embodiment of the memory system will be explained below in detail with reference to the accompanying drawings. The present invention is not limited to the following embodiments.

First Embodiment

Figure 1:
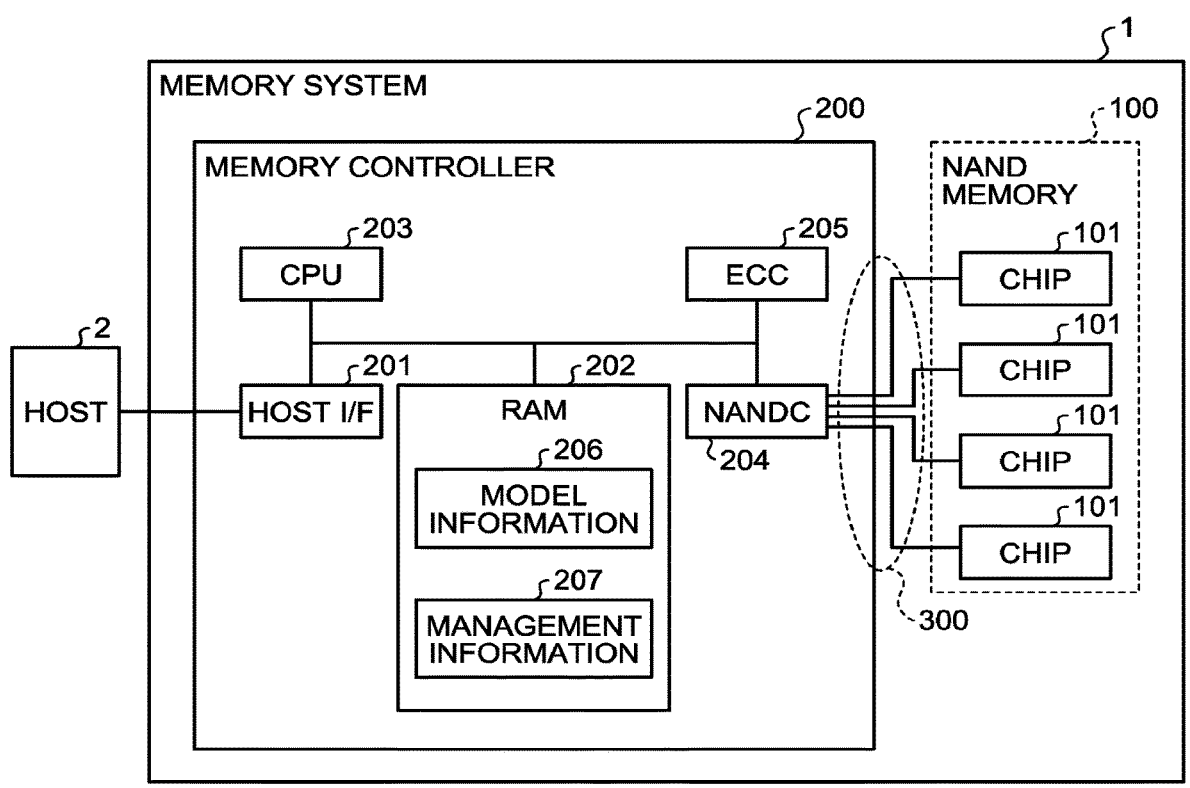
FIG. 1 is a schematic diagram illustrating an example of a configuration of a memory system according to a first embodiment.

FIG. 1 is a schematic diagram illustrating an example of a configuration of a memory system 1 according to an embodiment. The memory system 1 is configured to be connectable to a host 2. The host 2 corresponds to, for example, a personal computer, a portable information terminal, or a server.

The memory system 1 can accept an access request from the host 2. The access request includes a read command and a write command.

The memory system 1 includes a NAND flash memory (NAND memory) 100 and a memory controller 200 that executes data transmission between the host 2 and the NAND memory 100. The NAND memory 100 and the memory controller 200 are electrically connected by a bus 300 having a plurality of channels.

The memory controller 200 includes a host interface (Host I/F) 201, a random access memory (RAM) 202, a central processing unit (CPU) 203, a NANDC 204, and an error correction circuit (ECC) 205. The host interface 201, the RAM 202, the CPU 203, the NANDC 204, and the ECC 205 are connected to be communicable with each other via, for example, a bus.

The memory controller 200 can be configured as a System-on-a-Chip (SoC), for example. The memory controller 200 may be configured by a plurality of chips. The memory controller 200 may include a field-programmable gate array (FPGA) or an application specific integrated circuit (ASIC), instead of the CPU 203. That is, the memory controller 200 can be configured by software, hardware, or a combination thereof.

The RAM 202 is a memory used as a buffer or a work area for the CPU 203. The type of memory constituting the RAM 202 is not limited to a specific type. For example, the RAM 202 is configured by Dynamic Random Access Memory (DRAM), Static Random Access Memory (SRAM), or a combination thereof.

The host interface 201 controls a communication interface with the host 2. The host interface 201 executes data transmission between the host 2 and the RAM 202 under the control of the CPU 203. The NANDC 204 executes data transmission between the NAND memory 100 and the RAM 202 under the control of the CPU 203.

The CPU 203 controls the host interface 201, the RAM 202, the NANDC 204, and the ECC 205. The CPU 203 implements control of various components described above by executing a firmware program loaded in the RAM 202, for example.

The ECC 205 encodes the data transmitted to the NAND memory 100. The encoding is encoding using an error correction code. The ECC 205 executes decoding on the data transmitted from the NAND memory 100, thereby detecting and correcting a bit error included in the data.

The encoding method used by the ECC 205 is not limited to a specific method. In one example, low density parity check (LDPC) may be employed as the encoding method.

The NAND memory 100 includes one or more memory chips 101. Each of the one or more memory chips 101 is electrically connected to the NANDC 204 via the bus 300. Here, as an example, the NAND memory 100 includes four memory chips 101.

Figure 2:
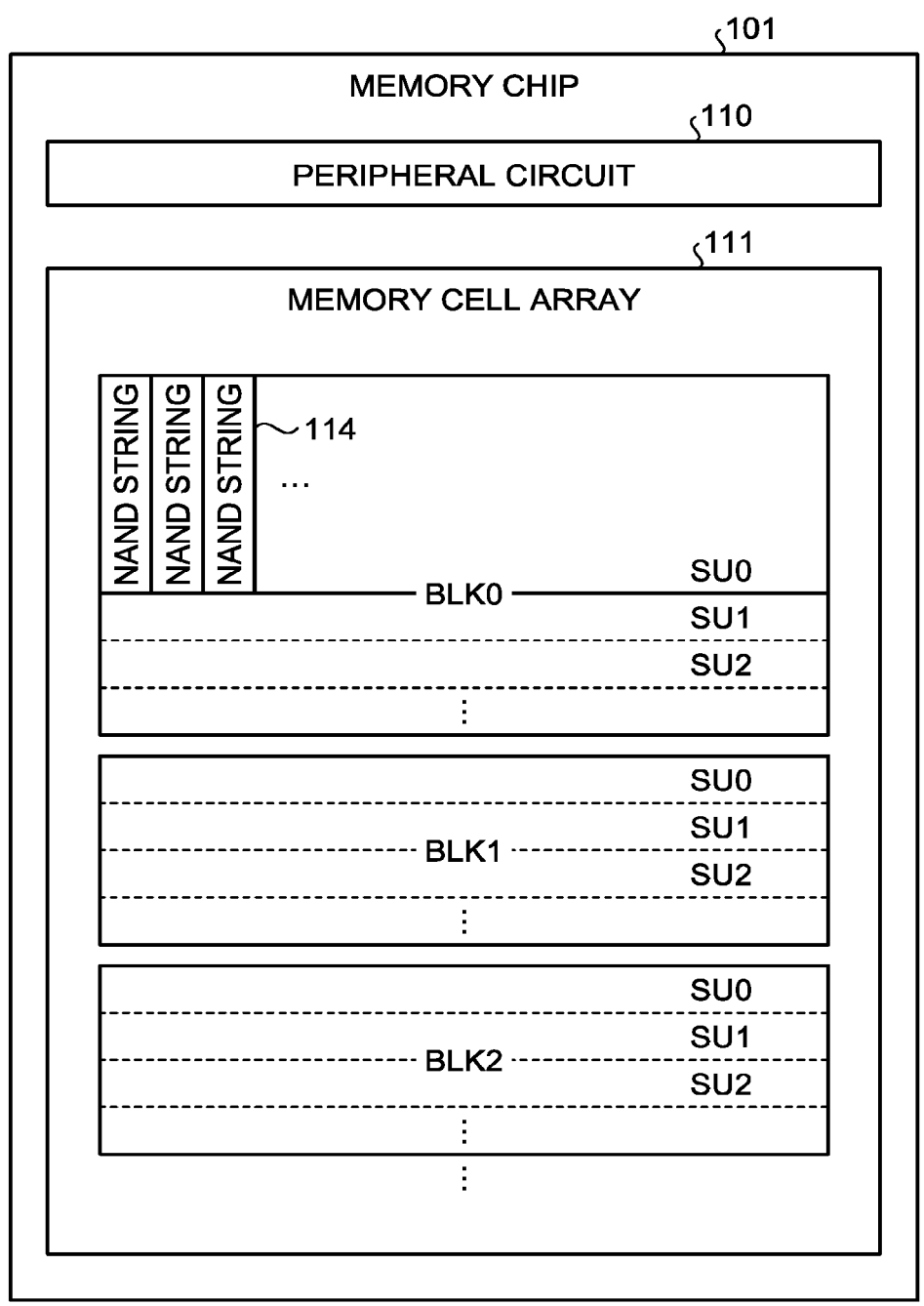
FIG. 2 is a schematic diagram illustrating an example of a configuration of a memory chip of FIG. 1.

FIG. 2 is a schematic diagram illustrating an example of a configuration of the memory chip 101 in FIG. 1. As illustrated, the memory chip 101 includes a peripheral circuit 110 and a memory cell array 111.

The memory cell array 111 includes a plurality of blocks BLK (BLK0, BLK1, BLK2, . . . ), each of which is a set of a plurality of nonvolatile memory cell transistors. Each of the plurality of blocks BLK includes a plurality of string units SU (SU0, SU1, SU2, . . . ), each of which is a set of memory cell transistors associated with a word line and a bit line. Each of the plurality of string units SU includes a plurality of NAND strings 114 with which the memory cell transistors are connected in series. Note that the number of NAND strings 114 in the string unit SU is arbitrary.

The peripheral circuit 110 includes, for example, a row decoder, a column decoder, a sense amplifier, a latch circuit, and a voltage generation circuit. When the peripheral circuit 110 receives a command from the memory controller 200, the peripheral circuit 110 executes processing corresponding to the command among program processing, read processing, and erase processing on the memory cell array 111.

Figure 3:
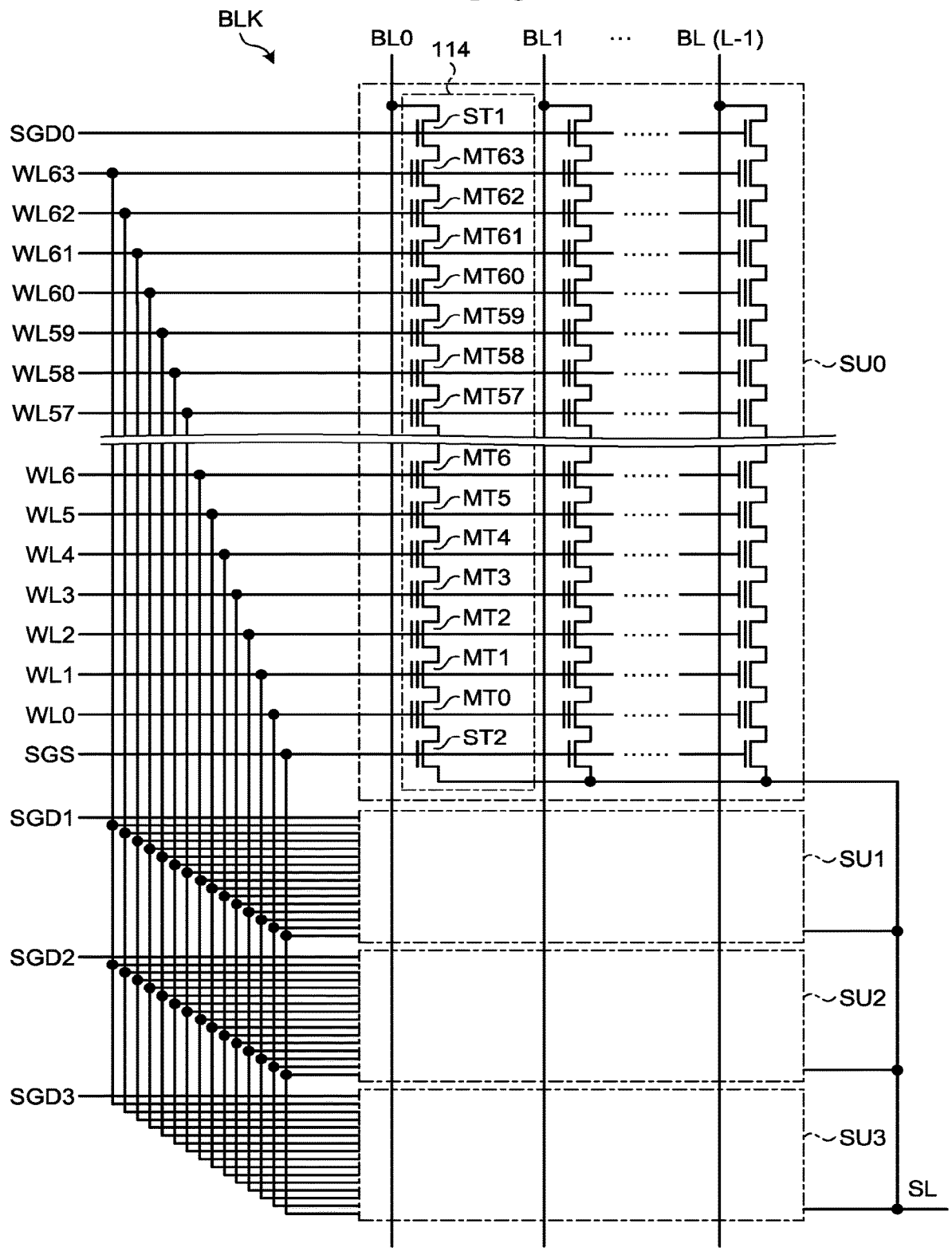
FIG. 3 is a schematic diagram illustrating an example of a circuit configuration of a block of FIG. 2.

FIG. 3 is a schematic diagram illustrating an example of a circuit configuration of the block BLK in FIG. 2. Each block BLK has the same configuration. The block BLK has, for example, four string units SU0 to SU3. Each string unit SU includes a plurality of NAND strings 114.

Each of the plurality of NAND strings 114 includes, for example, 64 memory cell transistors MT (MT0 to MT63) and selection transistors ST1 and ST2. The memory cell transistor MT includes a control gate and a charge storage layer, and holds data in a nonvolatile manner. The 64 memory cell transistors MT (MT0 to MT63) are connected in series between a source of the selection transistor ST1 and a drain of the selection transistor ST2. The memory cell transistor MT may be a MONOS type using an insulating film as the charge storage layer or an FG type using a conductive film as the charge storage layer. Further, the number of memory cell transistors MT in the NAND string 114 is not limited to 64.

The gate of the selection transistor ST1 in each of the string units SU0 to SU3 is connected to selection gate lines SGD0 to SGD3, respectively. On the other hand, the gate of the selection transistor ST2 in each of the string units SU0 to SU3 are commonly connected to a selection gate line SGS, for example. The gate of the selection transistor ST2 in each of the string units SU0 to SU3 may be connected to different selection gate lines SGS0 to SGS3 for each string unit SU. The control gates of the memory cell transistors MT0 to MT63 in the same block BLK are commonly connected to the word lines WL0 to WL63, respectively. Hereinafter, the word line WL may be referred to as a word line.

The drain of the selection transistor ST1 of each NAND string 114 in each string unit SU is connected to different bit lines BL (BL0 to BL(L−1), where L is a natural number of 2 or more). Further, the bit line BL is commonly connected to one NAND string 114 in each string unit SU between the plurality of blocks BLK. Further, the source of each selection transistor ST2 is commonly connected to a source line SL.

That is, the string unit SU is a set of NAND strings 114 connected to different bit lines BL and connected to the same selection gate line SGD. In addition, the block BLK is a set of the plurality of string units SU that share the word line WL. The memory cell array 111 is a set of the plurality of blocks BLK that share the bit line BL.

The program processing and the read processing by the peripheral circuit 110 can be collectively executed for the memory cell transistors MT connected to one word line WL in one string unit SU. A collection of 1-bit data that can be subjected to the program processing or the read processing for one word line WL in one string unit SU is denoted as "page".

The erase processing by the peripheral circuit 110 is executed for each block BLK. That is, all data stored in one block BLK is erased collectively.

Figure 4:
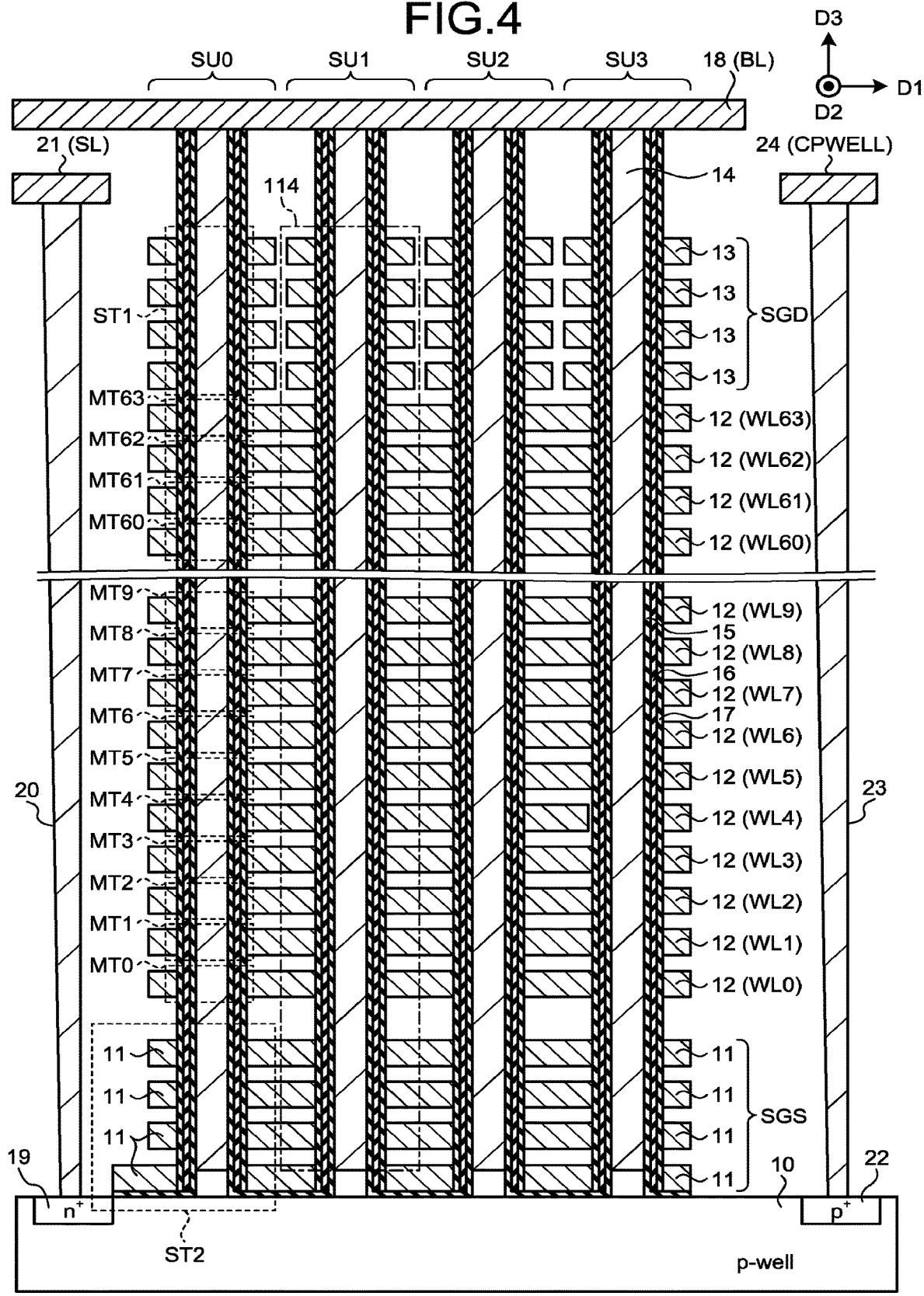
FIG. 4 is a cross-sectional view of a partial region of a block of FIG. 3.

FIG. 4 is a cross-sectional view of a partial region of a block of FIG. 3. As illustrated in the drawing, the plurality of NAND strings 114 are formed on a p-type well region (semiconductor substrate) 10. That is, on the well region 10, for example, a wiring layer 11 of four layers functioning as the selection gate line SGS, a wiring layer 12 of 64 layers functioning as the word lines WL0 to WL63, and a wiring layer 13 of, for example, four layers functioning as the selection gate line SGD are sequentially stacked. An insulating film is formed between the stacked wiring layers.

A pillar-shaped conductor 14 is formed so as to penetrate the wiring layers 13, 12, and 11 and reach the well region 10. A gate insulating film 15, a charge storage layer (insulating film or conductive film) 16, and a block insulating film 17 are sequentially formed on a side surface of the conductor 14, and thus, the memory cell transistor MT and the selection transistors ST1 and ST2 are formed. The conductor 14 functions as a current path of the NAND string 114 and becomes a region where a channel of each transistor is formed. An upper end of the conductor 14 is connected to a metal wiring layer 18 that functions as the bit line BL.

In a surface region of the well region 10, an n+-type impurity diffusion layer 19 is formed. A contact plug 20 is formed on the diffusion layer 19, and the contact plug 20 is connected to a metal wiring layer 21 that functions as the source line SL. Further, a p+-type impurity diffusion layer 22 is formed in the surface region of the well region 10. A contact plug 23 is formed on the diffusion layer 22, and the contact plug 23 is connected to a metal wiring layer 24 that functions as a well wiring CPWELL. The well wiring CPWELL is a wiring for applying a potential to the conductor 14 through the well region 10.

A plurality of the above configurations are arranged in the second direction D2 parallel to the semiconductor substrate, and the string unit SU is formed by a set of the plurality of NAND strings 114 arranged in the second direction D2.

The configurations illustrated in FIGS. 2 to 4 are examples. The configuration of the memory cell array 111 is not limited to the configuration described above. For example, the memory cell array 111 may have a configuration in which the NAND strings 114 are two-dimensionally arranged.

Hereinafter, the memory cell transistor MT is simply referred to as a memory cell.

Figure 5:
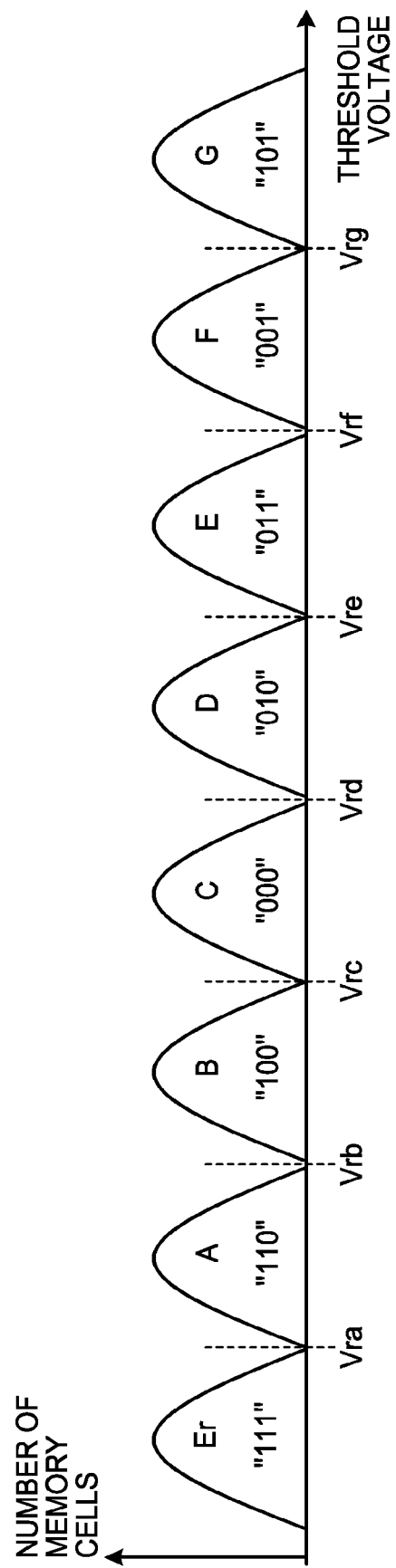
FIG. 5 is a schematic diagram illustrating an example of a threshold voltage distribution of a memory cell of FIG. 3 or FIG. 4.

FIG. 5 is a schematic diagram illustrating an example of a threshold voltage distribution of a memory cell of FIG. 3 or FIG. 4. In the distribution illustrated in FIG. 5, a vertical axis represents the number of memory cells (memory cell number), and a horizontal axis represents a threshold voltage. That is, the drawing illustrates the distribution of the memory cells with respect to the threshold voltage.

In the examples described below, a method called Triple Level Cell (TLC) is applied as a method for holding data in each memory cell, unless otherwise specified. According to the TLC method, each memory cell can hold 3-bit data. That is, in the present embodiment, a case where the memory cell can hold 8-level data is described, but the holdable data is not limited to 8-level. In the present embodiment, it is sufficient that the memory cell can hold 2-level or more data (data of 1 bit or more).

In the example illustrated in FIG. 5, a possible range of the threshold voltage is divided into eight ranges. These eight divisions are called "Er" state, "A" state, "B" state, "C" state, "D" state, "E" state, "F" state, and "G" state in order from the lowest threshold voltage. The threshold voltage of each memory cell is controlled by the peripheral circuit 110 so as to belong to any one of the "Er" state, "A" state, "B" state, "C" state, "D" state, "E" state, "F" state, and "G" state. As a result, when plotting the number of memory cells against the threshold voltage, the memory cells ideally form eight non-overlapping distributions belonging to different states as illustrated in the drawing.

The eight states correspond to 3-bit data. According to the example in the drawing, the "Er" state corresponds to "111", the "A" state corresponds to "110", the "B" state corresponds to "100", the "C" state corresponds to '000', the "D" state corresponds to "010", the "E" state corresponds to "011", the "F" state corresponds to "001", and the "G" state corresponds to "101". Thus, each memory cell can hold data corresponding to the state to which the threshold voltage belongs. The correspondence illustrated in FIG. 5 is an example of data coding. The data coding is not limited to the example of the drawing.

Of the 3-bit data held in one memory cell, a least significant bit (LSB) is expressed as a lower bit, a most significant bit (MSB) is expressed as an upper bit, and a bit between the LSB and MSB is expressed as a middle bit.

The threshold voltage is lowered to the "Er" state by the erase processing. In addition, the threshold voltage is maintained in the "Er" state by program processing, or can be raised until reaching any one of the "A" state, "B" state, "C" state, "D" state, "E" state, "F" state, and "G" state.

Hereinafter, a memory cell in which the threshold voltage is set in a certain state by the program processing may be referred to as a memory cell belonging to the state.

A read voltage is set between two adjacent states. For example, as illustrated in FIG. 5, a read voltage Vra is set between the "Er" state and the "A" state, a read voltage Vrb is set between the "A" state and the "B" state, a read voltage Vrc is set between the "B" state and the "C" state, a read voltage Vrd is set between the "C" state and the "D" state, a read voltage Vre is set between the "D" state and the "E" state, a read voltage Vrf is set between the "E" state and the "F" state, and a read voltage Vrg is set between the "F" state and the "G" state. That is, in the TLC mode in which eight states are set, seven read voltages are set. In the read processing, the peripheral circuit 110 specifies a state to which the memory cell belongs using a plurality of read voltages, and decodes the specified state into data.

Note that a value of the read voltage can be expressed in various amounts. Also, the value of the read voltage can be indicated by various expressions. In the present embodiment, as an example, a reference value is preset for each type of read voltage (Vra to Vrg), and the value of the read voltage is expressed by a shift amount that is a difference from the reference value. In addition, the reference value is stored for each type of read voltage at a predetermined position in the memory chip 101. The memory controller 200 instructs the memory chip 101 on the shift amount from the reference value for each type of read voltage.

Note that the method of expressing the read voltage and the method of instructing the read voltage are not limited thereto. For example, the value of the read voltage may be expressed by a voltage value instead of the difference, and the read voltage may be indicated to the memory chip 101 by the voltage value instead of the difference with respect to the reference value.

The case where the memory cells form the eight distributions that do not overlap each other has been described above with reference to FIG. 5. However, the threshold voltage of the memory cell can vary due to various factors. The threshold voltage of the memory cell can change depending on, for example, an access to the memory cell, an elapsed time or temperature history from the completion of the program to the memory cell, an access to a memory cell adjacent to the memory cell, and an exhaustion state of the memory cell. The exhaustion state of the memory cell is affected by the number of times the erase processing/ program processing is executed for the memory cell and the temperature during the erase processing/program processing for the memory cell. When the threshold voltage of the memory cell changes, the distribution for each state may be overlapped with each other during the read processing.

Figure 6:
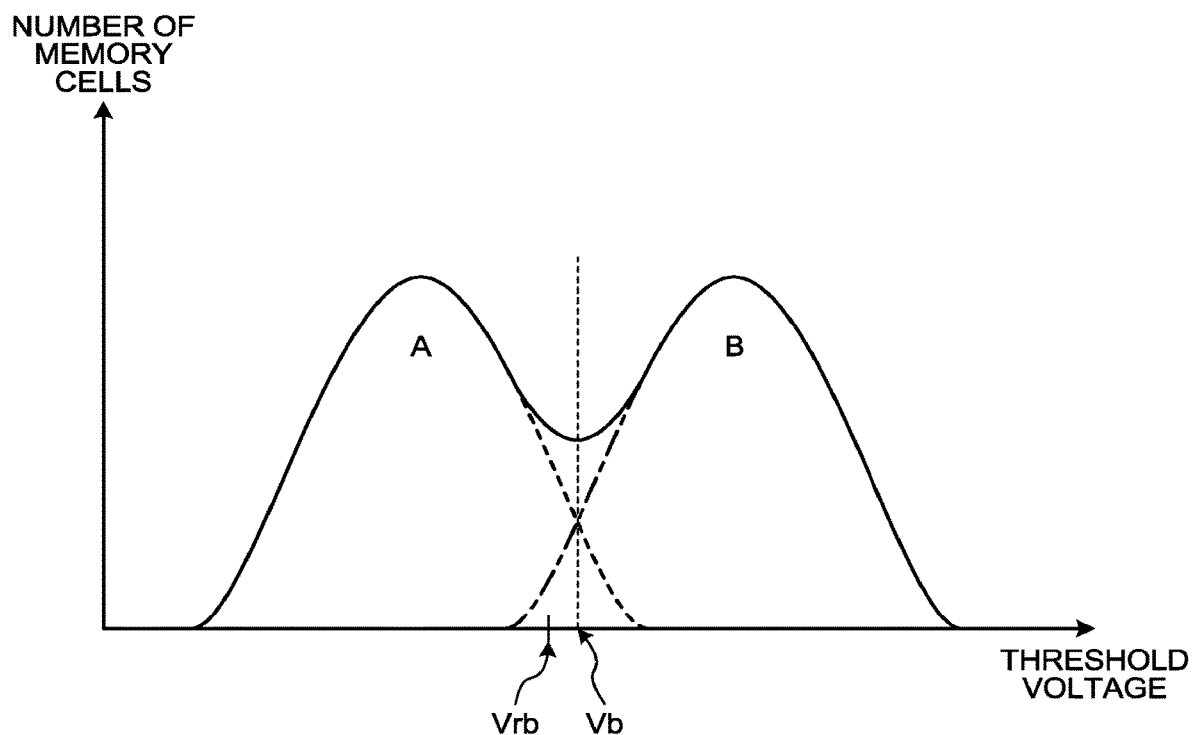
FIG. 6 is a schematic diagram illustrating another example of the threshold voltage distribution of the memory cell of FIG. 3 or FIG. 4.

FIG. 6 is a schematic diagram illustrating another example of the threshold voltage distribution of the memory cell of FIG. 3 or FIG. 4. In the example illustrated in FIG. 6, for simplicity of explanation, the distribution of memory cells belonging to any one of the "A" state and the "B" state is illustrated. A solid line indicates a distribution of memory cells belonging to any one of the "A" state and the "B" state. A broken line indicates a distribution of memory cells belonging to the "A" state, and an alternate long and short dash line indicates a distribution of memory cells belonging to the "B" state. In the example illustrated in the drawing, a base of the distribution of memory cells belonging to the "A" state and a base of the distribution of memory cells belonging to the "B" state overlap. In other words, the maximum value of the threshold voltage of the memory cell belonging to the "A" state exceeds the read voltage Vrb, and the minimum value of the threshold voltage of the memory cell belonging to the "B" state is lower than the read voltage Vrb. When a memory cell belonging to the "A" state and having the threshold voltage greater than the read voltage Vrb is read, the memory cell is recognized as belonging to the "B" state. That is, data programmed as "110" is read as "100". When a memory cell belonging to the "B" state and having the threshold voltage smaller than the read voltage Vrb is read, the memory cell is recognized as belonging to the "A" state. That is, data programmed as "100" is read as "110".

Thus, the read data may have changed from the value at the time of programming due to a change in threshold voltage. In other words, if some or all of the threshold voltage lobes exceed the read voltage at the boundary between the states, erroneous data determination occurs. That is, a value different from that at the time of program processing is read. The value different from that at the time of program processing is expressed as a bit error. In order to suppress the occurrence of bit errors, it is required to set the read voltage following the change in threshold voltage.

The memory controller 200 can deal with the bit error by error correction by the ECC 205 and shift of the read voltage.

For example, the memory controller 200 performs the error correction using the ECC 205 on the data acquired from the NAND memory 100. When the error correction fails, the memory controller 200 acquires the optimum values of the read voltages Vra to Vrg, sets the acquired optimum values of the read voltages Vra to Vrg as new set values, and retries the read processing. The read processing to be retried is referred to as read retry processing.

Note that the failure of error correction means that data before change cannot be restored from data after change. Specifically, the failure of error correction means that error bits included in read data cannot be corrected. Successful error correction means that all error bits included in the read data have been corrected.

Note that the optimum value of the read voltage refers to a value of the read voltage that can reduce an occurrence rate of bit errors as much as possible. Hereinafter, the optimum value of the read voltage may be referred to as an optimum read voltage. For example, in the case of FIG. 6, between the "A" state and the "B" state, when the threshold voltage is Vb, the distribution of the memory cells is minimal. Therefore, by using Vb as a new read voltage set value, the occurrence of bit errors in which data programmed as "110" is read as "100", or data programmed as "100" is read as "110" can be reduced.

The optimum value of the read voltage is not limited to the threshold voltage at the minimum point of the distribution of the memory cells, as long as it is a value for minimizing the occurrence rate of bit error. The threshold voltage value at another point of the minimum point may be used as the optimum value of the read voltage.

As the background processing, the memory controller 200 periodically performs patrol read of the NAND memory 100, observes the threshold voltage in the patrol read, and acquires an optimum read voltage. The optimum read voltage acquired in the patrol read is held in management information as an observation value. In other words, the memory controller 200 updates the set value of the read voltage for the plurality of memory cells at a plurality of time points. Here, the patrol read is not a read operation in response to a request (read command) from the host 2, but is a read operation performed spontaneously in the memory system 1, for example, at a preset cycle or time point. On the other hand, a host read is a read operation performed in response to a read command from the host 2. At the time of host read, the optimum read voltage (management information) observed by the latest patrol read can be used as a read voltage for reading data specified by the read command.

From this, the patrol read can also be expressed as an operation of observing the optimum value of the read voltage (updating the management information).

However, when performing the patrol read, data is read from the corresponding block and/or word line of the processing. That is, at the time of patrol read, the channel connected to the memory chip 101 including the block and/or word line among the plurality of channels of the bus 300 is in a state where the channel is occupied (used) by the patrol read. In other words, when the patrol read is executed, a bandwidth of the channel viewed from the host 2 is reduced. For this reason, when the patrol read is executed at the time of host read, the increase in a channel occupation rate due to the patrol read deteriorates the performance of the host read. For this reason, it is difficult to increase an observation frequency of the threshold voltage.

On the other hand, if a time interval between successive patrol reads is increased, that is, the observation frequency of the threshold voltage is lowered, the increase in the channel occupancy rate due to the patrol read can be suppressed, while followability of the read voltage to a time-varying threshold voltage is lowered. When the followability of the read voltage to the threshold voltage is lowered, read latency deteriorates due to the occurrence of erroneous data determination and the retry of read processing.

Therefore, the memory system 1 according to the present embodiment is configured to maintain the followability of the read voltage with respect to the change in the threshold voltage while reducing the observation frequency by updating the management information without using an observation value at a current time point in the background processing. In other words, the memory system 1 according to the present embodiment can improve the followability of the read voltage with respect to the change in the threshold voltage without increasing the observation frequency.

<Outline of Management Information Update Processing>

Figure 7:
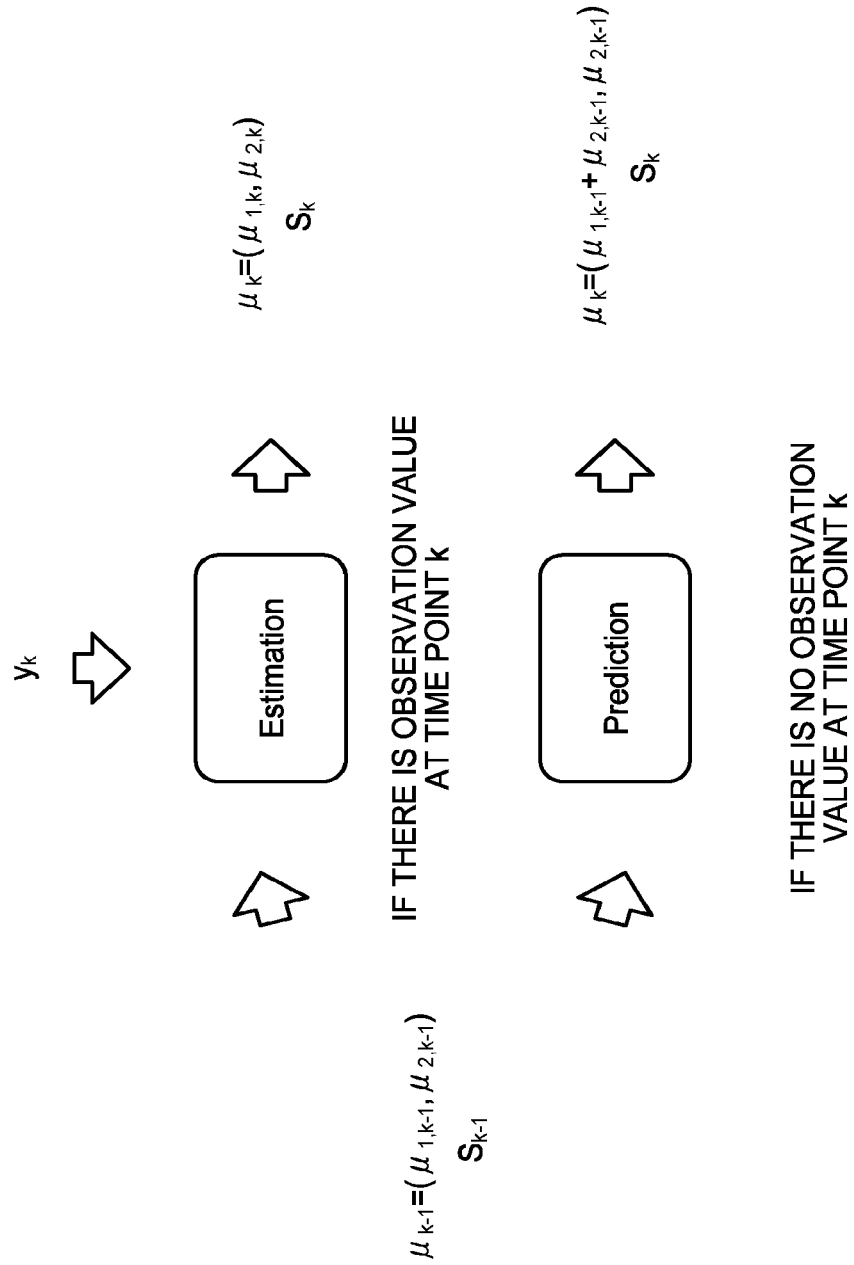
FIG. 7 is a diagram for explaining an outline of management information update processing in the memory system of FIG. 1.

FIG. 7 is a diagram for explaining an outline of management information update processing in the memory system 1 of FIG. 1. As illustrated in FIG. 7, the management information update processing includes a processing of updating management information using an observation value $y_k$ at a current time point k, and a processing of updating the management information without using the observation value $y_k$. Specifically, if there is the observation value $y_k$ at a time point k, management information ($\mu_k$, $S_k$) at the current time point k is estimated from management information ($\mu_{k-1}$, $S_{k-1}$) at a previous time point k−1 and the observation value $y_k$ at the current time k. On the other hand, if there is no observation value $y_k$ at the time point k, the management information ($\mu_k$, $S_k$) at the current time k is predicted from the management information ($\mu_{k-1}$, $S_{k-1}$) at the previous time point k−1. The management information is updated by the estimated/predicted management information ($\mu_k$, $S_k$) at the current time point k.

<Outline of Background Processing>

Figure 8:
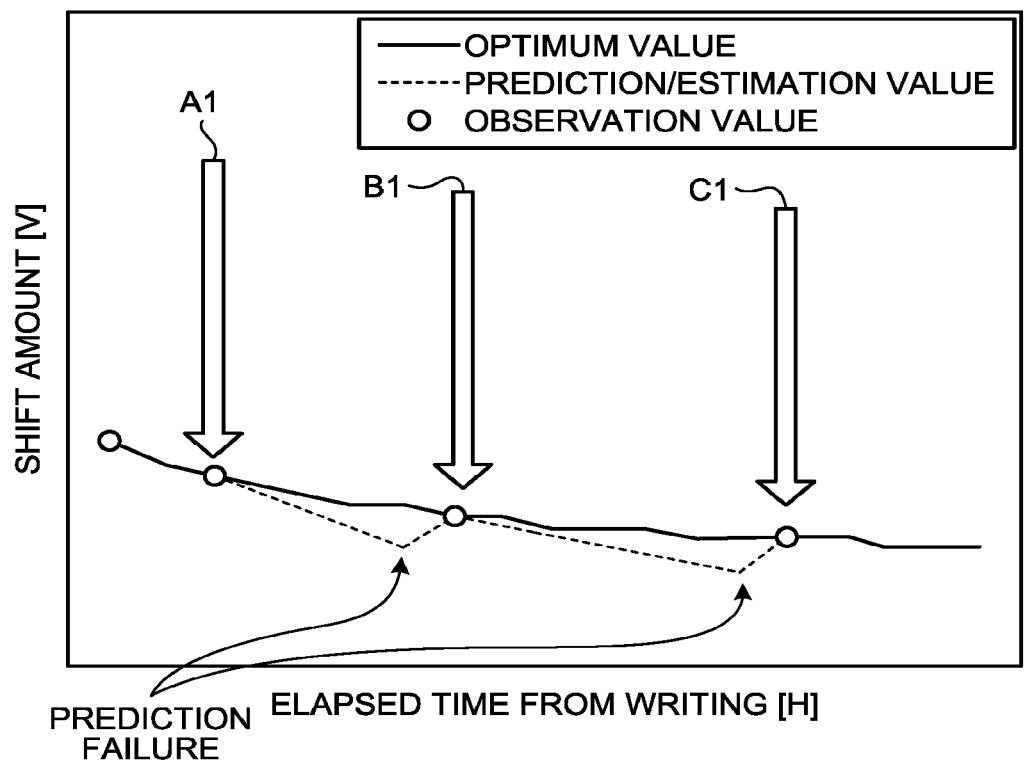
FIG. 8 is a diagram for explaining an outline of background processing in the memory system of FIG. 1.

FIG. 8 is a diagram for explaining an outline of background processing in the memory system 1 of FIG. 1. In the example illustrated in FIG. 8, a vertical axis represents a shift amount [V] indicating a shift amount from an initial set value (reference value) of the read voltage value, and a horizontal axis represents an elapsed time [H] from writing. Also, regarding a distribution of the shift amount illustrated in FIG. 8, a solid line indicates an optimum value of the read voltage, a broken line indicates the read voltage value (prediction value/estimation value) predicted/estimated by the memory system 1 according to the present embodiment, and a plot illustrates an optimum value (observation value) of the acquired (observed) read voltage. Here, the optimum value of the read voltage indicated by the solid line in FIG. 8 is a value acquired at each time point when observation is performed at each time point, and is an unknown value in the memory system 1 when no observation is performed.

In the background processing, it is assumed that the acquisition (observation) of the optimum read voltage is performed at a time point of arrow A1 in FIG. 8. Further, it is assumed that a prediction failure is detected by monitoring prediction accuracy at the time points of arrows B1 and C1. The prediction failure indicates that a difference between the optimum value of the read voltage and the estimation value/prediction value is large. Therefore, the prediction failure can be expressed as a prediction mismatch. In other words, when the prediction failure is detected, the prediction accuracy of the read voltage is low. Similarly, when no prediction failure is detected, it can be expressed that the prediction accuracy of the read voltage is high or acceptable. That is, monitoring the prediction accuracy means obtaining the prediction accuracy based on the prediction value of the read voltage and determining whether or not the obtained prediction accuracy is low (whether or not it has deteriorated). The acquisition (observation) of the optimum read voltage and the prediction failure will be described later.

At the time point of the arrow A1, the read voltage is estimated using the acquired observation value. The management information is updated by the estimation value. At the next time point, the observation value at that time point is not used, the read voltage is predicted using the estimation value, and the management information is updated by the prediction value. Thereafter, in the period up to the time point of the arrow B1, the management information is continuously updated using the prediction value periodically.

At the time points of the arrow B1 and the arrow C1, since the prediction failure is detected by monitoring the prediction accuracy, the acquisition (observation) of the optimum read voltage is performed. Thereafter, the management information continues to be updated periodically using the prediction value during the period up to the time point at which the prediction failure is detected again. Note that the management information may not be updated using the prediction value depending on an elapsed time since the most recent management information is updated, for example, immediately after the observation value is obtained by the host read processing and the management information is updated.

<Regarding Management Information Update Processing>

Hereinafter, the management information update processing will be described in more detail.

The management information update processing according to the present embodiment is realized, for example, by a state estimation method using a Kalman filter algorithm based on a model of a time change in the read voltage value. It is assumed that the model of the time change in the read voltage value is expressed by a state space model described below. In other words, the management information update processing according to the present embodiment is realized by the state estimation method based on the Kalman filter algorithm based on the state space model.

Note that a state space model described below is stored in advance in a predetermined position in the NAND memory 100, for example. When the memory system 1 is activated, the CPU 203 loads model information 206 into the RAM 202, for example, as illustrated in FIG. 1. Then, the CPU 203 realizes processing related to estimation and/or prediction of the management information based on the model information 206 loaded in the RAM 202.

Further, the CPU 203 stores the management information 207 in a predetermined position in the NAND memory 100, for example, before the power is turned off, and load the management information 207 in the RAM 202, when the power is turned on (the memory system 1 is activated) as illustrated in FIG. 1, for example. In the processing related to the estimation and/or prediction of the management information, the management information 207 is created at the time of writing the corresponding block and/or word line of the processing, and is updated according to the processing. The management information is created for each block and/or word line. For example, the management information is estimated and/or predicted for each predetermined read voltage, and is updated for each read voltage. A reference value or an estimated and/or predicted read voltage can be used as the predetermined read voltage. In addition, as the management information, a value estimated and/or predicted for at least one read voltage may be used for updating the management information related to another read voltage. In addition, the management information may be updated using an arithmetic value such as an average value or a median value of values estimated and/or predicted for at least two read voltages. The management information includes an estimation value of the read voltage, a prediction value of the read voltage, and a value of the time change amount of the read voltage, which will be described below. Further, when the write data of the corresponding block is erased or invalidated, the held management information is erased or invalidated.

<Regarding state space model>

Hereinafter, it is assumed that there is a means for obtaining the observation value $y_k$, of the read voltage at discrete time points k (k=1, ..., n). Here, the discrete time points k (k=1, ..., n) are an example of a plurality of time points at which the set values of the read voltages for the plurality of memory cells are updated by the memory controller 200. Further, as state variables that cannot be directly observed, a true read voltage value $\mu_{1,k}$ at a time point k and a time change amount $\mu_{2,k}$ are considered. The relationship between these variables is represented by a state space model. The state space model includes a state equation and an observation equation. Here, the true read voltage value $\mu_{1,k}$ is an example of a set value of the read voltage. Further, the time change amount $\mu_{2,k}$ of the true read voltage value $\mu_{1,k}$ is an example of the change amount of the set value of the read voltage.

In the present embodiment, it is assumed that a state equation representing a state transition from the time point k-1 to k, that is, a state transition from a state vector $\mu_{k-1}$ to a state vector $\mu_k$ is expressed by Equation (1).

$$\begin{pmatrix} \mu_{1,k} \\ \mu_{2,k} \end{pmatrix} = \begin{pmatrix} 1 & 1 \\ 0 & 1 \end{pmatrix} \begin{pmatrix} \mu_{1,k-1} \\ \mu_{2,k-1} \end{pmatrix} + \begin{pmatrix} v_{1,k-1} \\ v_{2,k-1} \end{pmatrix} \quad (1)$$

Here, it is assumed that a vector $v_{k-1}$ is a process error vector according to a normal distribution. In addition, it is assumed that an average of each component (element) of the vector $v_{k-1}$ is 0. In addition, it is assumed that a true covariance matrix Q of the state vector $\mu$ is as follows.

$$Q = \begin{pmatrix} \sigma_{v1}^2 & 0 \\ 0 & \sigma_{v2}^2 \end{pmatrix}$$

Note that the state equation illustrated in Equation (1) can be expressed as in Equation (2).

$$\mu_k = T\mu_{k-1} + v_{k-1} \quad (2)$$

$$T = \begin{pmatrix} 1 & 1 \\ 0 & 1 \end{pmatrix}, \mu_k = (\mu_{1,k}, \mu_{2,k})^t, v_k = (v_{1,k}, v_{2,k})^t$$

In the present embodiment, the observation equation at the time point k is expressed by Equation (3).

$$y_k = \mu_{1,k} + w_k \ldots \quad (3)$$

Here, $w_k$ is an observation error according to a normal distribution. In addition, an average of $w_k$ is assumed to be 0. In addition, the variance of $w_k$ is assumed to be $\sigma_w^2$. Note that the observation equation illustrated in Equation (3) can also be expressed as in Equation (4).

$$y_k = Z\mu_k + w_k \quad (4)$$

$$Z = (1\ 0)$$

<Regarding Kalman Filter Algorithm>

Here, a state estimation method using the Kalman filter algorithm based on the above-described state equation will be described. In the management information update processing, a state vector $\hat{\mu}_k$ and a covariance matrix $S_k$ of the state vector $\hat{\mu}_k$ are updated according to the following three steps. Note that a known parameter, an initial value, an input, and an output are as illustrated below. However, $\sigma_0$ is assumed to be a reasonably large value.

Known Parameters:

$$Q = \begin{pmatrix} \sigma_{v1}^2 & 0 \\ 0 & \sigma_{v2}^2 \end{pmatrix}, \sigma_w^2$$

Initial Value:

$$\hat{\mu}_0 = (0, 0)^t, S_0 = \begin{pmatrix} 1 & 0 \\ 0 & 1 \end{pmatrix} \sigma_0^2$$

Input:

$\hat{\mu}_{k-1}, S_{k-1}, y_k$

Output:

$\hat{\mu}_k, S_k$

<<1. Prediction Processing>>

First, prediction processing for obtaining an intermediate value of the state vector $\hat{\mu}_k$ and the covariance matrix $S_k$ of the state vector $\hat{\mu}_k$ is performed according to the following relational expression. The prediction process is processing of performing a priori prediction that predicts the management information at the time point k (current time point) based on the management information at the time point k-1 (one previous time point) as illustrated in the following relational expression. In the relational expression illustrated below, a (1,1) component of the covariance matrix $S_k$ is a value corresponding to the variance of the prediction value, and is a value indicating reliability of the prediction value at the current time point k. That is, the variance of the prediction value is a variance relating to the set value updated at one previous time point. Here, the time point k (current time point) is an example of a first time point. Further, the tune point k-1 (one previous time point) is an example of a second time point. The prediction processing is an example of a third operation.

$$\hat{\mu}_k^- = T\hat{\mu}_{k-1}$$

$$S_k^- = TS_{k-1}T^t + Q$$

After the prediction processing, the management information update processing is performed. As will be described below, update processing when the observation value $y_k$ is obtained (for example at the time points of arrows A1, B1, and C1 in FIG. 8), and update processing when the observation value $y_k$ is not obtained (for example, the period of arrows A1 to B1, the period of arrows B1 to C1, and the period of arrow C1 in FIG. 8) are different from each other.

<<2. Update Processing when Observation Value $y_k$ is obtained>>

Here, a case where the observation value $y_k$ at the current time point k is obtained will be described. Here, the current time point k when the observation value $y_k$ is obtained is an example of a predetermined time $v_{k-1}$ point among a plurality of time points. In addition, the update processing when the observation value $y_k$ is obtained is an example of the first operation. First, a prediction error v is obtained using the intermediate value of the state vector obtained by the prediction processing. Next, a Kalman gain vector g is obtained.

$$v = y_k - Z\hat{\mu}_k^-$$

$$g = \frac{S_k^- Z^t}{ZS_k^- Z^t + \sigma_w^2}$$

Thereafter, the state estimation value (state vector $\hat{\mu}_k$) and the covariance matrix $S_k$ of the state estimation value are updated using the obtained prediction error v and Kalman gain vector g.

$$\hat{\mu}_k = \hat{\mu}_k^- + gv$$

$$S_k = S_k^- - gZS_k^-$$

<<3. Update Processing when Observation Value $y_k$ is not Obtained>>

Here, a case where the observation value $y_k$ at the current time point k is not obtained will be described. Here, the current time point k when the observation value $y_k$ is not obtained is an example of a time point after one time point of a predetermined time point among a plurality of time points. In addition, the update processing when the observation value $y_k$ is not obtained is an example of the second operation. In this case, the state estimation value (state vector $\hat{\mu}_k$ and the covariance matrix $S_k$ of the state estimation value are updated using the prediction value (intermediate value) obtained by the priori prediction in the prediction processing as it is.

$$\hat{\mu}_k = \hat{\mu}_k^-$$

$$S_k = S_k^-$$

As described above, the memory system 1 according to the present embodiment updates the management information by the update processing including the estimation using the Kalman filter algorithm which is one of the methods for estimating the value when the observation value $y_k$ at the time point k exists. On the other hand, when there is no observation value $y_k$ at the time point k, the memory system 1 updates the management information by the update processing using the prediction value obtained by the priori prediction of the prediction processing.

Note that various methods can be used as an observation method (read method) of the optimum read voltage (threshold voltage). Specifically, for example, a read method using a shift table (hereinafter referred to as shift table read), a tracking read (also referred to as Vth Tracking), or the like can be used.

The shift table read is a read operation for specifying an index for specifying the optimum read voltage set that is successfully read by preparing a shift table in which a plurality of read voltage sets are registered for each page type (for example, LOWER/MIDDLE/UPPER page), and performing the read operation sequentially using each of the plurality of read voltage sets. In other words, the read operation is a read operation of specifying an optimum read voltage set by sequentially comparing each of the plurality of read voltage sets with the threshold voltage distribution of the plurality of memory cells of the NAND memory 100.

The tracking read is, for example, a read operation of generating a threshold voltage distribution histogram (hereinafter simply referred to as threshold voltage distribution) programmed in the plurality of memory cells included in the corresponding page by performing the read operation multiple times while shifting the read voltage by a predetermined step size, and specifying a shift amount for shifting the read voltage to a voltage level at which the reading is successful based on the generated threshold voltage distribution.

The tracking read may be a read method performed on the memory controller 200 side or a read method performed inside the NAND memory 100 (also referred to as On-Chip Tracking Read).

In addition, in the tracking read, by preparing a model (matrix) that illustrates the relationship between the histogram and the optimum value of the read voltage in advance, it is possible to specify the optimum value of the read voltage by coarsely setting a section of the histogram. Here, hereinafter, when simply referred to as the threshold voltage distribution, a histogram of threshold voltage distribution in which the section is coarsely set may also be included.

Hereinafter, an example of an operation of the memory system 1 according to the present embodiment will be described in more detail with reference to the drawings.

Figure 9:
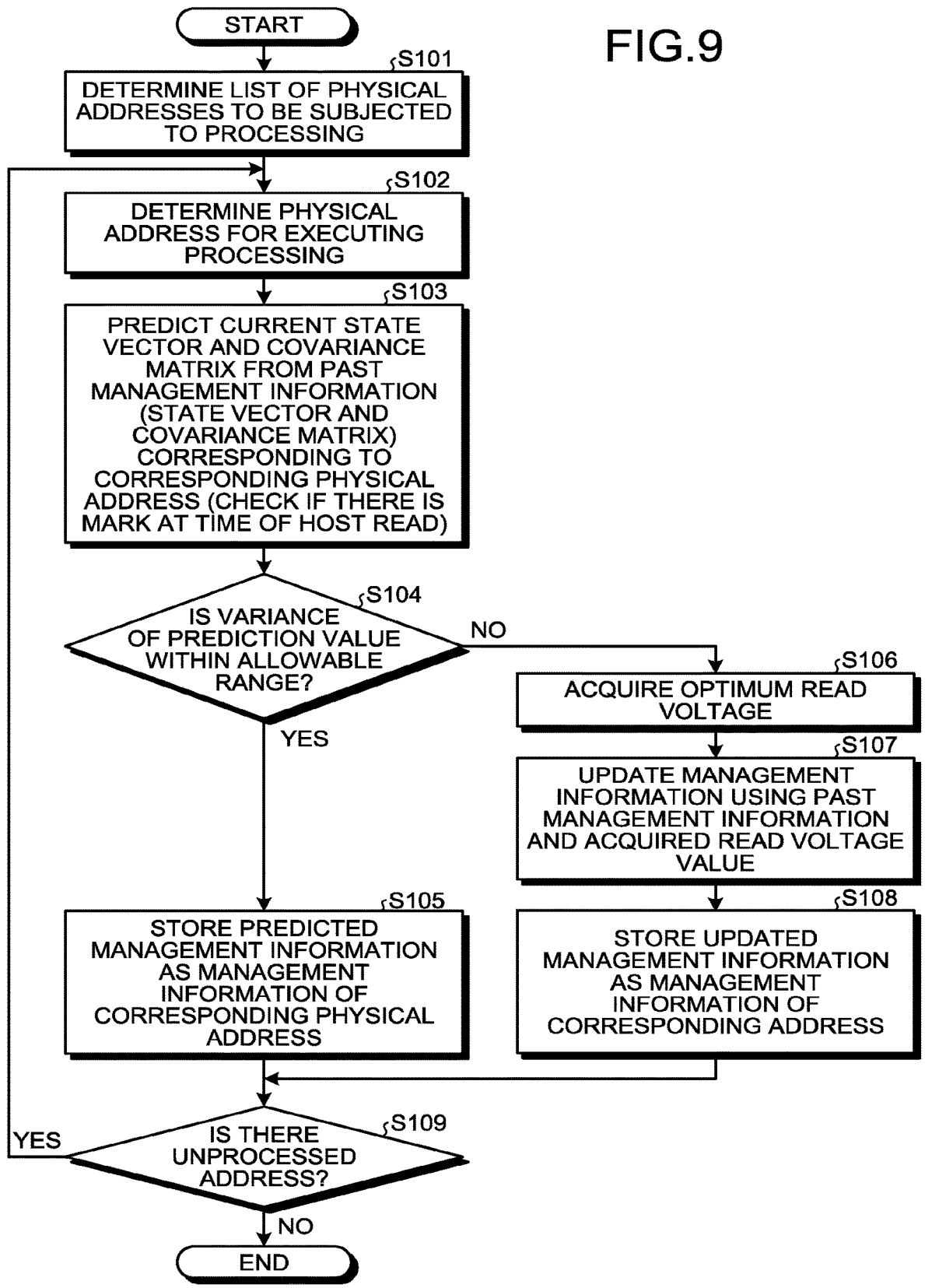
FIG. 9 is a flowchart illustrating an example of background processing executed in the memory system of FIG. 1.

FIG. 9 is a flowchart illustrating an example of the background processing executed in the memory system 1 of FIG. 1. The memory controller 200 periodically executes a flow of FIG. 9 so that all the physical blocks that are valid in the memory system 1 are completed within a predetermined time.

First, the memory controller 200 determines a list of physical addresses to be subjected to the background processing (S101).

Subsequent to S101, the memory controller 200 determines a physical address for executing the background processing (S102). Subsequent to S102, the memory controller 200 predicts current management information (state vector and covariance matrix) from past management information (state vector and covariance matrix) corresponding to the corresponding physical address (S103).

Subsequent to S103, the memory controller 200 determines whether or not the variance of the prediction value is within an allowable range based on the state vector before one point time corresponding to the physical address. In other words, the memory controller 200 determines whether or not the value of the (1,1) component of $S_k$ of the covariance matrix, which is a value corresponding to the variance of the prediction value, is within an allowable range (for example, a predetermined threshold value or less). The size of the allowable range (predetermined threshold value) is assumed to be preset and stored in a storage area in the memory controller 200, for example. The determination as to whether or not the variance of the prediction value is within the allowable range is a determination regarding the reliability of the prediction, and is an example of determining whether or not a prediction failure has been detected.

When it is determined that the variance of the prediction value is within the allowable range (S104: Yes), the memory controller 200 stores the updated state vector including the prediction value as management information of the corresponding physical address (S105). On the other hand, when it is not determined that the variance of the prediction value is within the allowable range (for example, greater than a predetermined threshold) (S104: No), the memory controller 200 observes the read voltage and acquires an optimum value of the read voltage (S106). Subsequent to S106, the memory controller 200 updates the management information using the past management information and the acquired read voltage value (S107), and stores an estimation value of the read voltage corresponding to the physical address and the updated state vector as management information of the physical address (S108). For these reasons, the determination in S104 is the determination of whether or not the observation value needs to be acquired, and can be expressed as a determination of whether to perform update processing (first operation) that involves the acquisition (observation) of the observation value and update processing (second operation) that does not involve the acquisition (observation) of the observation value, after the prediction processing (third operation).

Subsequent to S105 or S108, the memory controller 200 determines whether there is an unprocessed address among the physical addresses subject to the background processing (S109). The memory controller 200 repeats the flow from S102 to S109 if it is determined that there is an unprocessed address (S109: Yes), and ends this background processing if it is not determined that there is an unprocessed address (S109: No).

Figure 10:
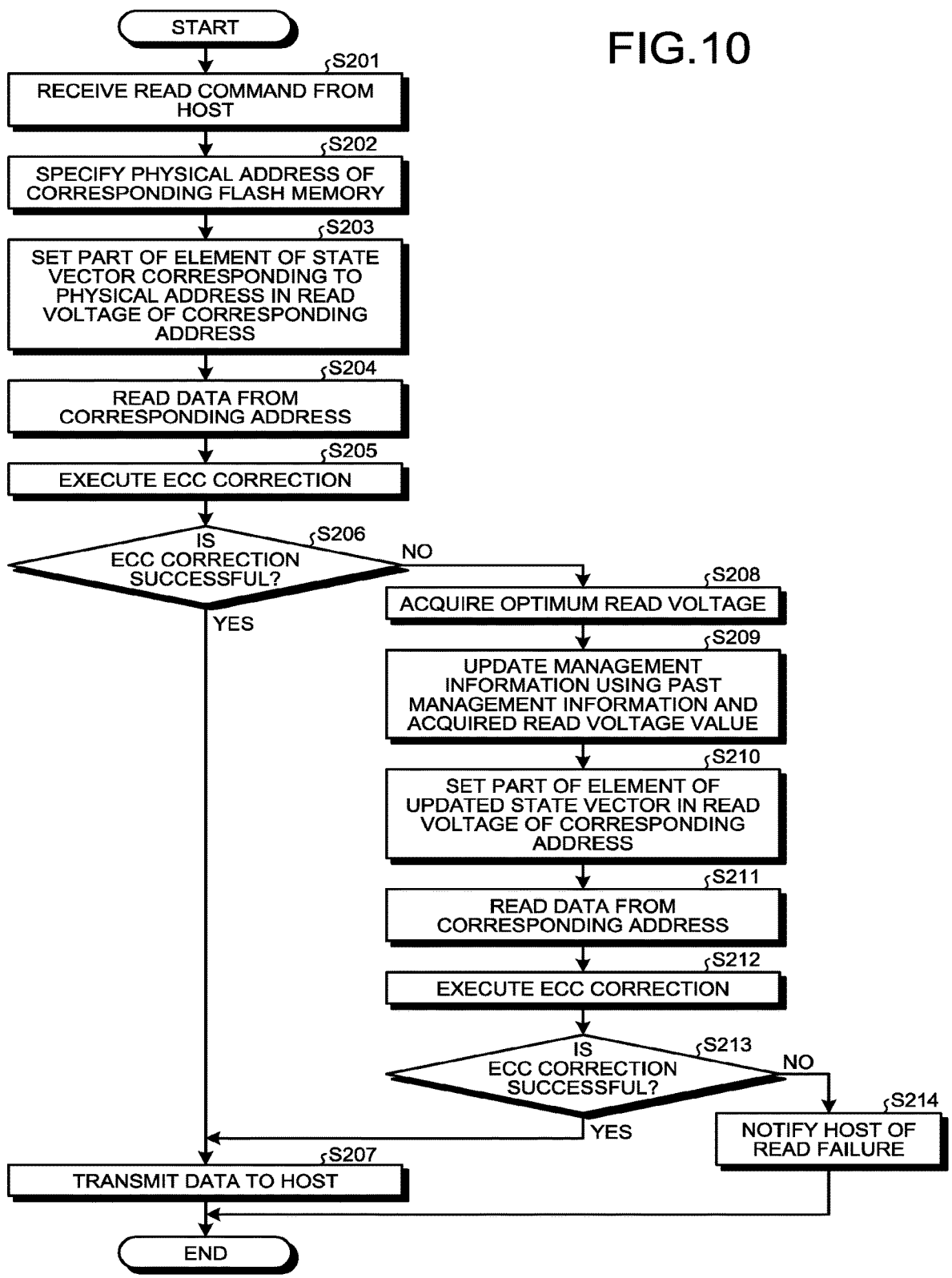
FIG. 10 is a flowchart illustrating an example of host read processing executed in the memory system of FIG. 1.

The management information updated in this way is used in the host read. FIG. 10 is a flowchart illustrating an example of host read processing executed in the memory system of FIG. 1.

After receiving the read command from the host 2 (S201), the memory controller 200 specifies a physical address of the corresponding NAND memory 100 (S202). Subsequent to S202, the memory controller 200 sets a part of the component (element) of the state vector corresponding to the corresponding physical address, that is, the prediction value of the read voltage, to a read voltage of the corresponding address (S203), and reads data from the corresponding address (S204). Subsequent to S204, the memory controller 200 performs error correction using the ECC 205 (S205), and determines whether the error correction is successful (S206).

When it is determined that the error correction is successful (S206: Yes), the memory controller 200 transmits the read data to the host 2 (S207) and ends the host read processing. On the other hand, when it is not determined that the error correction is successful (S206: No), the memory controller 200 executes a read retry processing (S208 to S212).

In the read retry processing, the memory controller 200 observes an optimum read voltage and acquires an optimum value of the read voltage, in the same manner as the background process described above (S208). Further, the memory controller 200 updates the management information using the past management information and the acquired read voltage value, and stores the estimation value of the read voltage corresponding to the corresponding physical address, the updated state vector, and the covariance matrix as management information (S209). Subsequent to S209, the memory controller 200 sets a part of the component of the updated state vector, that is, the estimation value of the updated read voltage, to the read voltage corresponding to the corresponding address (S210), and reads data from the corresponding address using the set read voltage (S211). Subsequent to S211, the memory controller 200 performs error correction using the ECC 205 (S212), and determines whether the error correction is successful (S213).

In the read retry processing, when it is determined that the error correction is successful (S213: Yes), the memory controller 200 transmits the read data to the host 2 (S207), and ends the host read processing. On the other hand, when it is not determined that the error correction is successful (S213: No), the memory controller 200 notifies the host 2 of a read failure (S214).

Note that the acquired (observed) value of the read voltage may be used in the read that is performed after the optimum value of the read voltage is acquired (observed), as in S211 of the read retry processing. For example, the update processing is executed based on the acquired (observed) optimum value (S209), and the acquired (observed) optimum value is temporarily set as a set value to read the data (S211), and then the updated estimation value may be set as the set value (S210). In this case, the update processing (S209, S210) may be executed after the reading by the temporary set value (S211). Further, for example, in the read retry processing, the value of the read voltage acquired (observed) in S208 may be used as the read voltage set in the read retry processing without executing S209 and S210. In this case, for example, when the error correction of the read retry processing fails (S213: No), S209 and S210 may be executed, or a mark may be put in the management information corresponding to the physical address so that the update processing using the observation value is executed in the next background processing. The mark that is put in the management information will be described later.

In the read retry processing, when it is not determined that the error correction is successful (S213: No), the memory controller 200 may execute another processing for improving an ECC success rate.

Note that an elapsed time from writing when the management information is updated is measured by the memory controller 200 based on a clock of the CPU 203, for example.

As described above, the background processing according to the present embodiment is configured to execute acquisition (observation) of the optimum read voltage when it is not determined that the variance of the prediction value is within the allowable range. According to this configuration, processing involving the reading can be reduced. In other words, it is possible to maintain the followability to time variation of the threshold voltage while reducing the frequency of patrol read. In addition, in the host read processing according to the present embodiment, the management information is updated in the read retry processing in the same manner as the background processing described above. According to this configuration, since the management information is updated using the optimum read voltage acquired (observed) at the time of host read, it is possible to further reduce the processing involving the reading in the background processing. That is, the memory system 1 according to the present embodiment can maintain the followability of the read voltage with respect to the change in the threshold voltage while reducing the observation frequency. In other words, the memory system 1 according to the present embodiment can improve the followability of the read voltage with respect to the change in the threshold voltage without increasing the observation frequency.

Further, in the management information update processing in the memory system 1 according to the present embodiment, if only the management information before one time point is held, the management information at that time point can be estimated and/or predicted.

Second Embodiment

In the first embodiment, the case where the Kalman filter algorithm is used for the management information update processing, that is, the case where the covariance matrix $S_k$ is updated, has been described as an example, but the present invention is not limited thereto. The memory system 1 according to the present embodiment performs management information update processing for updating an inverse correlation matrix $P_k$ using a recursive least square (RLS) algorithm.

<Regarding RLS Algorithm>

The RLS algorithm is an algorithm for sequentially obtaining a state vector $\hat{\mu}_k$ that minimizes the following cost function.

$$f(k) = \sum_{i=1}^{k} \lambda^{k-i} |y_i - Z\mu_i|^2 + \delta\lambda^k \|\mu_k\|^2$$

However, it is assumed that the vector $\mu_i$ ($i=1, 2, \ldots, k$) has the following relational expression.

$$\mu_i = T\mu_{i-1}$$

The RLS algorithm can be described in a manner similar to the Kalman filter algorithm described above, as illustrated below. In the management information update processing, the state vector $\hat{\mu}_k$ and the inverse correlation matrix $P_k$ of the state vector $\hat{\mu}_k$ are updated according to the following, three steps. Note that a known parameter, an initial value, an input, and an output are as illustrated below. Here, $\lambda$ a forgetting factor, and $\delta$ is a positive minute amount.

Known Parameters:

$$0 < \lambda \leq 1$$

Initial Value:

$$\hat{\mu}_0 = (0, 0)^t, P_0 = \delta^{-1} \begin{pmatrix} 1 & 0 \\ 0 & 1 \end{pmatrix}$$

Input:

$$\hat{\mu}_{k-1}, P_{k-1}, y_k$$

Output:

$\hat{\mu}_k, P_k$

<<1. Prediction Processing>>
First, a prediction process for obtaining an intermediate value of the state vector $\hat{\mu}_k$ and the inverse correlation matrix $P_k$ of the state vector $\hat{\mu}_k$ is performed using the following relational expression. The prediction process is processing of performing a priori prediction that predicts the management information at the time point k (current time point) based on the management information at the time point k-1 (one previous time point) as illustrated in the following relational expression. In the relational expression illustrated below, the (1,1) component of the inverse correlation matrix $P_k$ is a value indicating the reliability of the prediction value at the current time point k. Note that a matrix obtained by multiplying the inverse correlation matrix $P_k$ by a scaling constant corresponds to the covariance matrix $S_k$. Therefore, the (1,1) component of the inverse correlation matrix $P_k$ may be expressed as the variance of the prediction value of the read voltage. For example, in S104 of FIG. 9, it is determined whether or not the reliability of the prediction value is within an allowable range (for example, a predetermined threshold or less). In other words in the memory system 1, the memory controller 200 determines that the prediction accuracy is low when the variance of the prediction value, that is, the value of the (1,1) component of the inverse correlation matrix $P_k$ is larger than a predetermined threshold value. Here, as the predetermined threshold value, for example, a value obtained by dividing the threshold value according to the first embodiment by a scaling constant can be used. Thereafter, when the reliability of the prediction value is not within the allowable range (for example, greater than the predetermined threshold), the observation value $y_k$ is acquired (observed). Note that the memory controller 200 holds the value of the variance of the prediction value, that is, the value of the (1,1) component of the inverse correlation matrix $P_k$, at each of a plurality of time points when the set value of the read voltage is updated.

$\hat{\mu}_k^- = T\hat{\mu}_{k-1}$ $P_k^- = \lambda^{-1} T P_{k-1} T^t$

After the prediction processing, the management information update processing is performed. As will be described below, update processing when the observation value $y_k$ is obtained (for example, at the time points of arrows A1, B1, and C1 in FIG. 8), and update processing when the observation value $y_k$ is not obtained (or example, the period of arrows A1 to B1, the period of arrows B1 to C1, and the period of arrow C1 in FIG. 8) are different from each other.

<<2. Update Processing when Observation Value $y_k$ is Obtained>>
Here, a case where the observation value $y_k$ at the current time point k is obtained will be described. First, a prediction error v is obtained using the intermediate value of the state vector obtained by the prediction processing. Next, a gain vector g is obtained.

$v = y_k - Z\hat{\mu}_k^-$ $g = \dfrac{P_k^- Z^t}{1 + Z P_k^- Z^t}$

Thereafter, the state estimation value (state vector $\hat{\mu}_k$) and the inverse correlation matrix $P_k$ of the state estimation value are updated using the obtained prediction error v and gain vector g.

$\hat{\mu}_k = \hat{\mu}_k^- + gv$ $P_k = P_k^- - gZP_k^-$

<<3. Update Processing when Observation Value $y_k$ is not Obtained>>
Here, a case where the observation value $y_k$ at the current time point k is not obtained will be described. In this case, the state estimation value (state vector $\hat{\mu}_k$) and the inverse correlation matrix $P_k$ of the state estimation value are updated using the prediction value (intermediate value) obtained by the priori prediction in the prediction processing as it is.

$\hat{\mu}_k = \hat{\mu}_k^-$ $P_k = P_k^-$

Even if the management information update processing is performed in this manner, the same effects as those of the first embodiment can be obtained. Further, the state estimation method using the RLS algorithm has an effect that the calculation cost can be reduced because the amount of information held during the processing is small as compared with the state estimation method using the Kalman algorithm.

Third Embodiment

In the first embodiment, the background processing for detecting the prediction failure based on the (1,1) component (variation of prediction value) of the covariance matrix $S_k$ indicating the reliability of the prediction values has been described as an example, and in the second embodiment, the background processing for detecting the prediction failure based on the (1,1) component (variation of the prediction value) of the inverse correlation matrix $P_k$ indicating the reliability of the prediction value has been described as an example, but the present invention is not limited thereto. The prediction failure may be detected by another method. In the background processing according to the present embodiment, data is read based on management information predicted after current management information is predicted. The prediction failure is determined depending on whether or not the error correction relating to the read data is successful.

Figure 11:
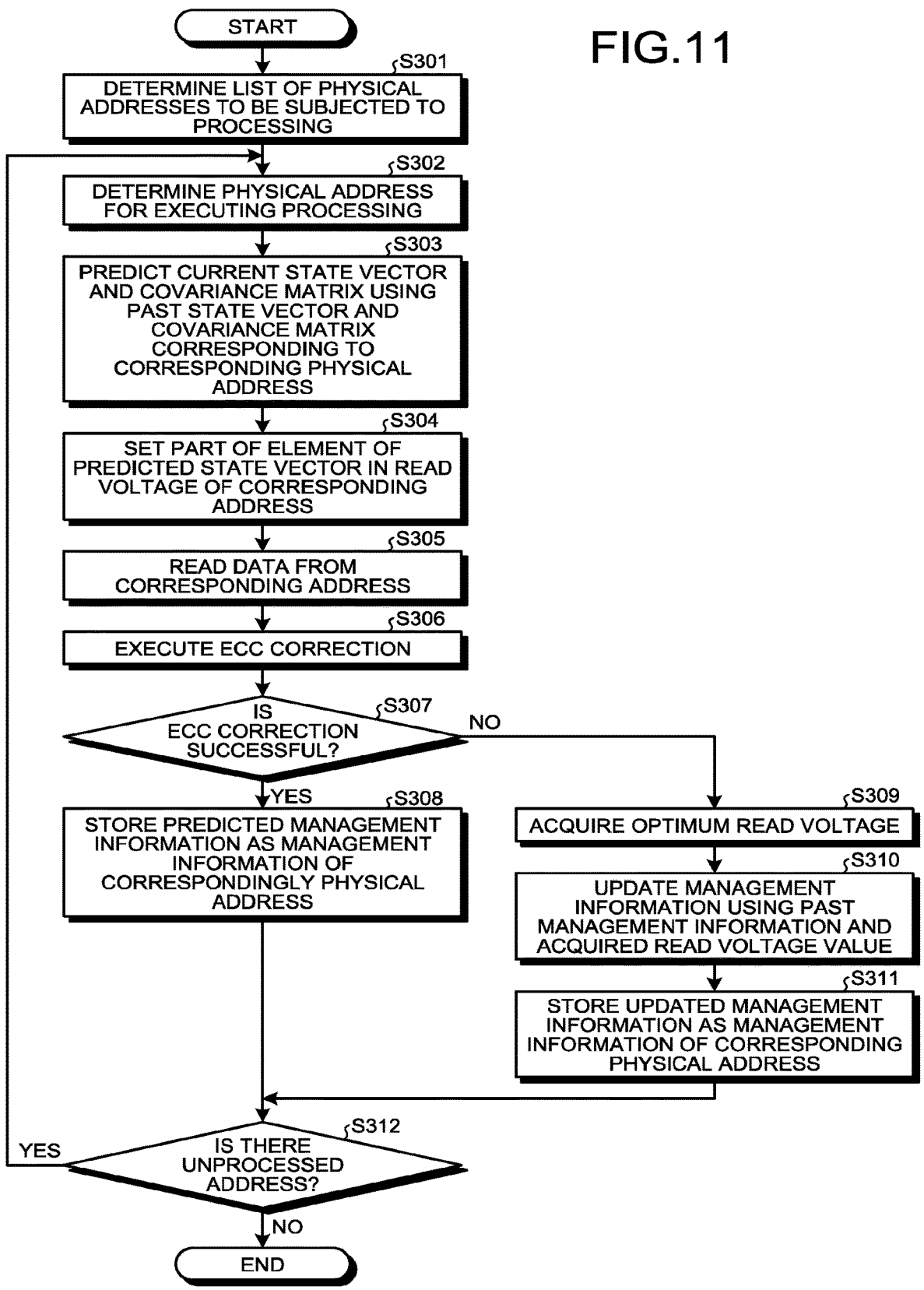
FIG. 11 is a flowchart illustrating another example of the background processing executed in the memory system of FIG. 1.

FIG. 11 is a flowchart illustrating another example of the background processing executed in the memory system 1 of FIG. 1.

The memory controller 200 determines a physical address list to be processed (S301), determines an address for executing the processing (S302), and predicts a state vector and a covariance matrix at the current time point using past management information (state vector and covariance matrix) corresponding to the physical address (S303), respectively, in the same manner as the background processing (S101 to S103 in FIG. 9) according to the first embodiment.

The memory controller 200 sets a part of the component (element) of the predicted state vector, that is, the prediction value of the read voltage to the read voltage of the corresponding address (S304), read data from the corresponding address (S305), performs an error correction using the ECC 205 (S306), and determines whether the error correction is successful (S307), in the same manner as the host read processing (S203 to S206 in FIG. 10) according to the first embodiment.

When it is determined that the error correction is successful (S307: Yes), the memory controller 200 stores the updated state vector including the prediction value as management information of the corresponding physical address (S308), in the same manner as the background processing (S105 in FIG. 9) according to the first embodiment. On the other hand, when it is not determined that the error correction is successful (S307: No), the memory controller 200 stores the updated management information using the acquired (observed) read voltage value (S309 to S311), in the same manner as the background processing according to the first embodiment (S106 to S108 in FIG. 9).

Subsequent to S308 or S311, the memory controller 200 determines whether there is an unprocessed address (S312) in the same manner as the background processing (S109 in FIG. 9) according to the first embodiment. The memory controller 200 repeats the flow from S302 to S312 if it is determined that there is an unprocessed address among the physical addresses subjected to the background processing (S312: Yes), and ends the background processing if it is not determined that there is an unprocessed address (S312: No).

As described above, the background processing according to the present embodiment detects the prediction failure based on whether or not the error correction is successful. With this configuration, the load associated with data reading increases as compared with the first embodiment, but it is possible to improve the followability to the time variation of the threshold voltage and the prediction/estimation accuracy.

Fourth Embodiment

In the first embodiment, the background processing for acquiring (observing) the optimum read voltage when a prediction failure is detected has been described as an example, but the present invention is not limited thereto. In the background processing according to the present embodiment, the optimum read voltage is acquired (observed) regardless of whether or not the prediction failure occurs, and the management information is updated by estimation using the above-described algorithm.

Figure 12:
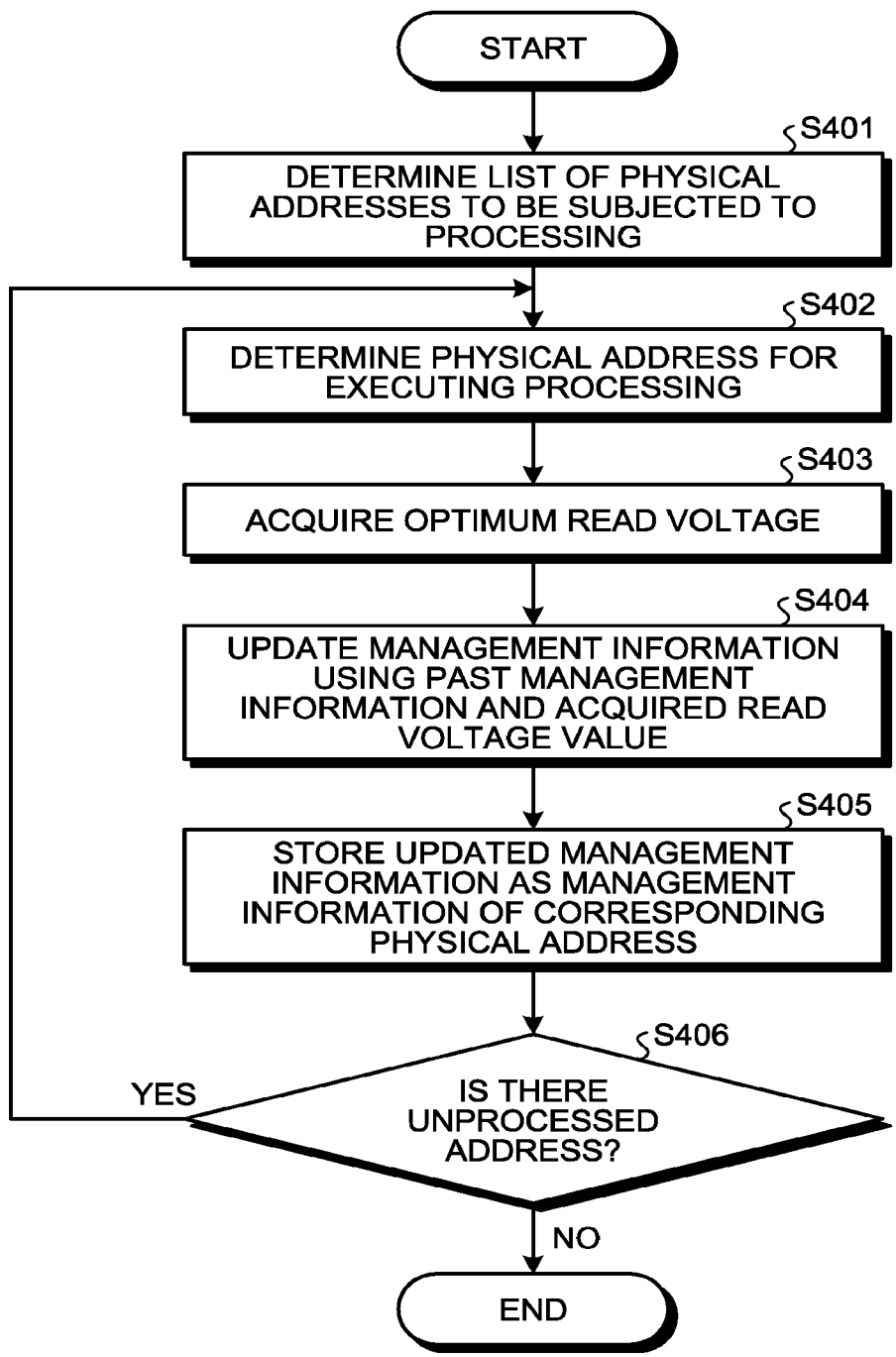
FIG. 12 is a flowchart illustrating another example of the background processing executed in the memory system of FIG. 1.

FIG. 12 is a flowchart illustrating another example of the background processing executed in the memory system 1 of FIG. 1.

The memory controller 200 determines a physical address list to be processed (S401), and determines an address for executing the processing (S402), in the same manner as the background processing (S101 to S102 in FIG. 9) according to the first embodiment.

The memory controller 200 acquires an optimum value of the read voltage by observing an optimum read voltage (S403), updates management information using the past management information and the acquired read voltage (S404), and stores the updated management information as the management information of the corresponding physical address (S405), respectively, in the same manner as the background processing (S106 to S108 in FIG. 9) according to the first embodiment. After that, the memory controller 200 determines whether there is an unprocessed address among the physical addresses to be subjected to the background processing (S406), in the same manner as the background processing (S109 in FIG. 9) according to the first embodiment. In this determination, if it is determined that there is an unprocessed address (S406: Yes), the flow from S402 to S406 is repeated, and if it is not determined that is an unprocessed address (S406: No), the background processing ends.

As described above, the background processing according to the present embodiment acquires (observes) the optimum read voltage regardless of whether or not the prediction failure occurs. With this configuration, the frequency of the patrol read is increased as compared with the first embodiment, but it is possible to improve the followability to the time variation of the threshold voltage and the prediction/estimation accuracy.

Fifth Embodiment

In the host read processing according to the fifth embodiment, when error correction is successful, it is further determined whether or not the observation value needs to be acquired in the next background processing.

Figure 13:
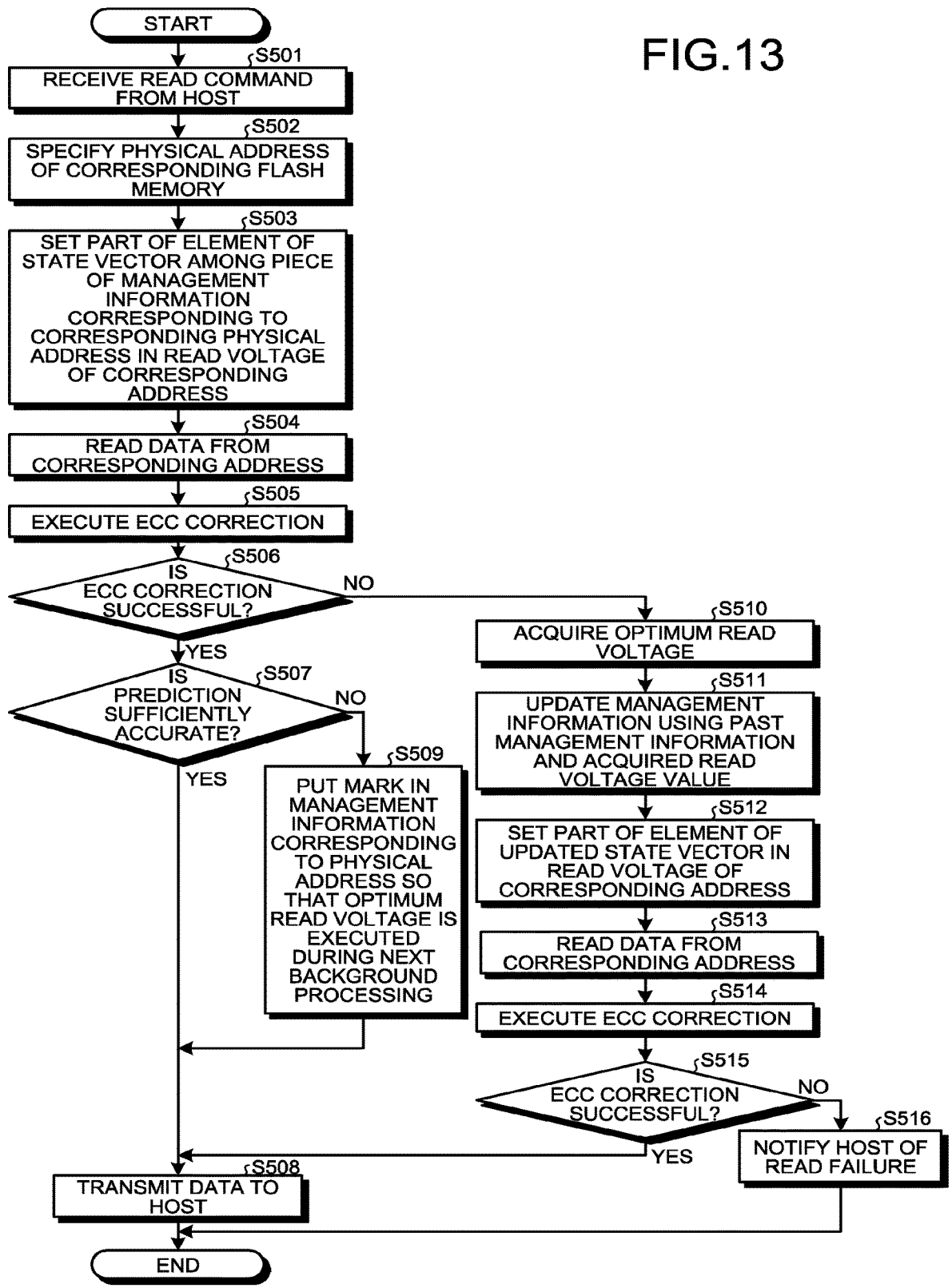
FIG. 13 is a flowchart illustrating another example of the host read processing executed in the memory system of FIG. 1.

FIG. 13 is a flowchart illustrating another example of the host read processing executed in the memory system 1 of FIG. 1.

S501 to S506 are the same as the host read processing (S201 to S206 in FIG. 10) according to the first embodiment, respectively.

When it is determined that the error correction is successful (S506: Yes), the memory controller 200 determines whether or not the prediction by the management information update processing is sufficiently accurate (S507). This determination is performed based on, for example, whether or not a bit error rate (BER) is larger than a predetermined threshold. The predetermined threshold related to BER may be set as appropriate, but for example, if correction up to 1% can be performed by the error correction, 80% (0.8%) thereof or the like may be used as the predetermined threshold related to BER. Further, this determination may be performed based on bit error asymmetry. The determination based on bit error asymmetry may be performed based on, for example, the number and/or ratio of data programmed as "0" being read as "1", the number and/or ratio of data programmed as "1" being read as "0", and whether a value such as a ratio of these numbers is larger than a predetermined threshold. Further, the determination based on the bit error asymmetry may be performed based on, for example, the number and/or ratio of the data read as "0" being error-corrected to "1", the number and/or ratio of the data read as "1" being error-corrected to "0", and whether a value such as a ratio of these numbers is larger than a predetermined threshold. Further, this determination may be performed based on both the BER and the bit error asymmetry. It is assumed that various threshold values used for the determination are set in advance and stored in a storage area in the memory controller 200, for example.

When it is determined that the prediction is sufficiently accurate (S507: Yes), the memory controller 200 transmits the read data to the host 2 (S508), and ends the host read processing, in the same manner as the host read processing (S207 in FIG. 10) according to the first embodiment. On the other hand, when it is determined that the prediction is not sufficiently accurate (S507: No), the memory controller 200 puts a mark in the management information corresponding to the physical address so that the optimum read voltage is acquired (observed) during the next background processing. That is, the determination in S507 can be expressed as determining whether or not the observation value needs to be acquired in the next background processing. The mark that is put in the management information is referred to when the management information is predicted in the background processing (S103 in FIG. 9). In other words, in the next background processing, the memory controller 200 confirms whether or not there is a mark at the time of host read when predicting current management information based on past management information (S103 in FIG. 9). As a method of putting the mark in the management information, for example, a method of storing a very large value (a value of variance of the prediction value exceeding the allowable range) in the covariance matrix can be used. In this case, in the next background processing, it is determined that the variance of the prediction value exceeds the allowable range (S104: No in FIG. 9), and the optimum read voltage is acquired (observed) (S106 in FIG. 9).

Note that the time point for putting the mark in the management information may be, for example, after the read data is transmitted to the host 2 (S508).

On the other hand, when it is not determined that the error correction is successful (S506: No), the memory controller 200 executes the read retry processing (S510 to S516) in the same manner as the host read processing (S208 to S214 in FIG. 10) according to the first embodiment.

As described above, the host read processing according to the present embodiment further determines whether or not the observation value needs to be acquired in the next background processing when the error correction is successful. According to this configuration, even if the error correction is successful, the observation value can be acquired in the next background processing when the prediction is insufficient. For this reason, it is possible to improve the followability to the time variation of the threshold voltage and the prediction/estimation accuracy compared to the first embodiment.

In the background processing, whether or not the observation value needs to be acquired may be determined in the same manner as the host read processing according to the present embodiment.

Sixth Embodiment

Immediately after data is written in a memory such as the NAND memory 100, the threshold voltage changes (e.g., decreases) greatly. For this reason, in the background processing according to the present embodiment, different management information update processing is executed between a period immediately after writing of data and a subsequent period.

Figure 14:
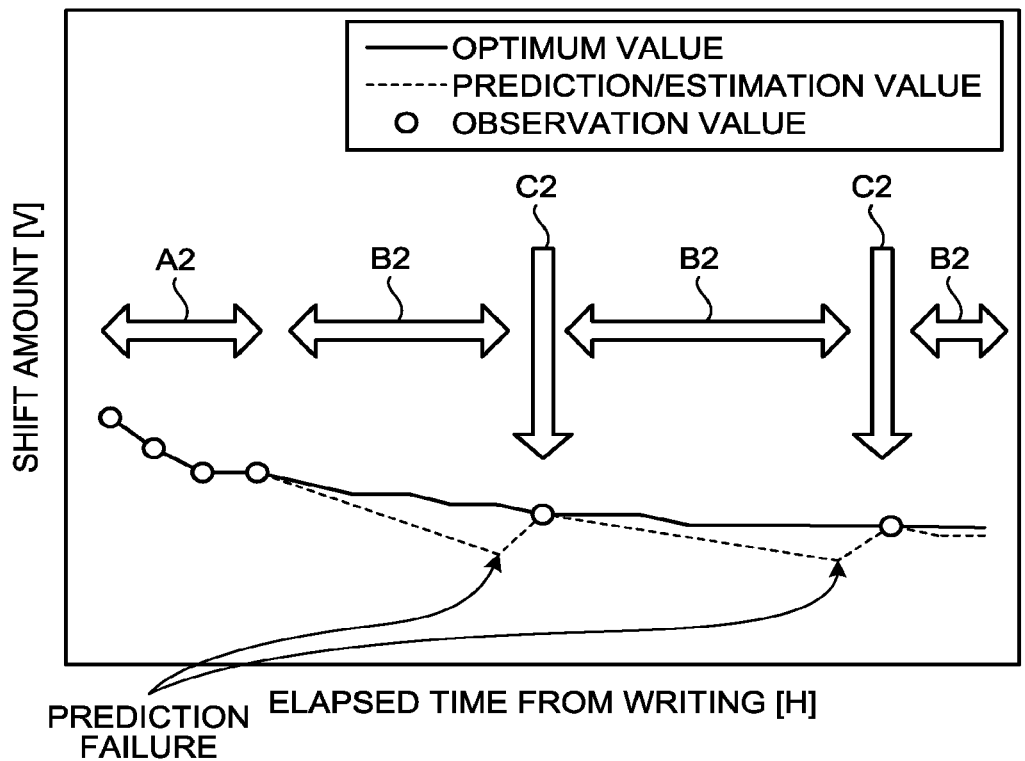
FIG. 14 is a diagram for explaining an outline of another example of the background processing in the memory system of FIG. 1.

FIG. 14 is a diagram for explaining an outline of another example of the background processing in the memory system of FIG. 1. In the example illustrated in FIG. 14, a vertical axis indicates a shift amount [V] indicating the shift amount from an initial set value of the read voltage value, and a horizontal axis indicates an elapsed time [H] from writing. Also, regarding a distribution of the shift amount illustrated in FIG. 14, a solid line indicates an optimum value of the read voltage, a broken line indicates the read voltage value (prediction value/estimation value) predicted/estimated by the memory system 1 according to the present embodiment, and a plot illustrates an optimum value (observation value) of the acquired (observed) read voltage. Here, the optimum value of the read voltage indicated by the solid line in FIG. 14 is a value acquired at each time point when observation is performed at each time point, and is an unknown value in the memory system 1 when no observation is performed.

A period indicated by an arrow A2 in FIG. 14 is a period immediately after the writing of data to the memory cell. Further, it is assumed that a period indicated by an arrow B2 is a period after a predetermined time has elapsed since the writing of data to the memory cell. Further, it is assumed that a prediction failure is detected at a time point indicated by an arrow C2.

In the period indicated by arrow A2, the optimum read voltage is acquired (observed) at regular time intervals to follow a large change in the threshold voltage, and the management information is updated by the estimation value calculated using the observation value. That is, in the period indicated by the arrow A2, for example, background processing similar to the background processing according to the third embodiment is executed.

On the other hand, in the period indicated by the arrow B2, after the management information is predicted and updated based on the estimation value, the management information is continuously updated based on the prediction value until a prediction failure is detected at the time point indicated by the arrow C2. When the prediction failure is detected, the observation value is acquired, and the management information is estimated and updated based on the observation value. That is, in the period indicated by the arrow B2, for example, background processing similar to the background processing according to the first embodiment is executed.

Note that the period of the arrow A2 and the period of the arrow B2 may be switched at a predetermined elapsed time from the writing, and may be switched when it is determined that a change in the observation value has become smaller based on the comparison result between the observation value and/or the amount of change in the observation value and a predetermined threshold. Note that the predetermined elapsed time and the predetermined threshold may be set in advance and stored in the storage area of the memory controller 200, for example.

As described above, in the background processing according to the present embodiment, different management information update processing is executed between the period immediately after the writing of data and the subsequent period. According to this configuration, it is possible to improve the followability to the time variation of the threshold voltage or the prediction/estimation accuracy as compared with the first embodiment.

Seventh Embodiment

In the memory system 1, the power supply may be cut off for some reason. Since the background processing is not executed during the period when the power supply to the memory system 1 is cut off, the management information is not updated. On the other hand, the threshold voltage can change regardless of whether or not the management information is updated. For this reason, there is a possibility that the management information cannot follow the change in the threshold voltage when the power supply is resumed. Therefore, the memory system 1 according to the present embodiment is configured to repeat the management information update processing when the power supply is resumed.

When the power supply is resumed, the memory controller 200 acquires (observes) the optimum read voltage at the current time point, predicts the read voltage based on the latest management information updated before the power supply is cut off, and compares the observation value with the prediction value. When the prediction value matches the observation value, the memory controller 200 resumes normal background processing. Here, the fact that the prediction value matches the observation value includes the case where a difference between the prediction value and the observation value is within a predetermined range. On the other hand, when the prediction value does not match the observation value, the memory controller 200 continues to update the management information until the prediction value matches the observation value.

Note that the comparison between the observation value and the prediction value may be performed in the same manner as the detection of the prediction failure according to the above-described embodiment. In other words, the memory controller 200 may be configured to repeat the management information update processing until no prediction failure is detected when the power supply is resumed.

Figure 15:
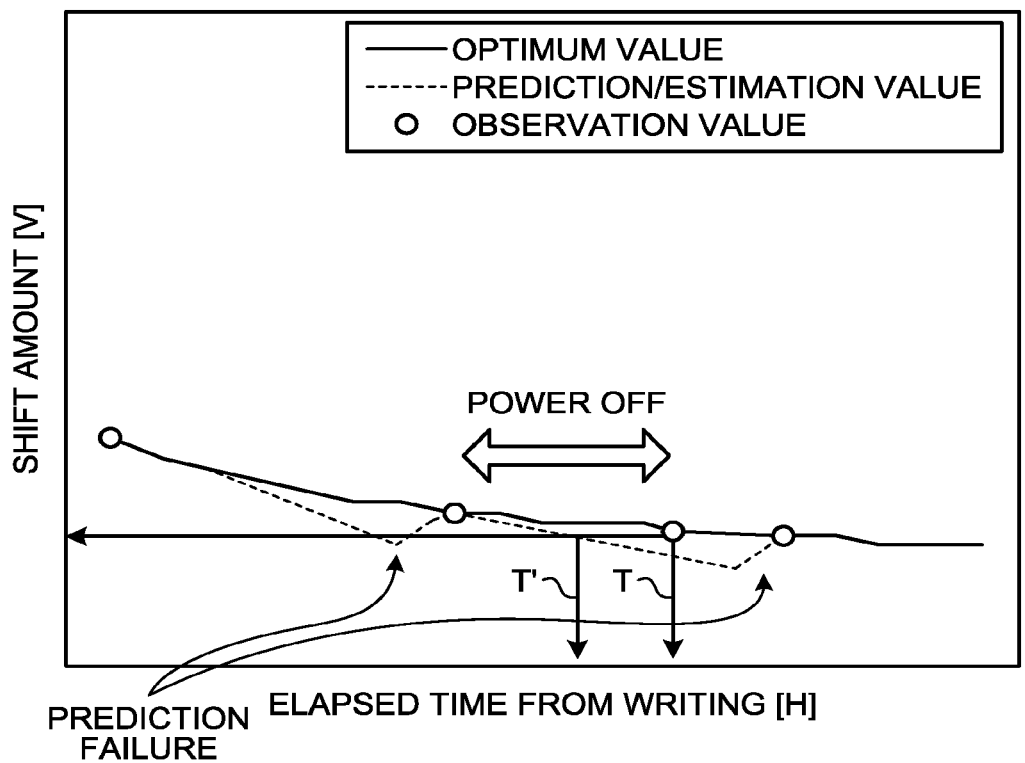
FIG. 15 is a diagram for explaining estimation of an elapsed time in the memory system of FIG. 1.

Here, the period in which the power supply is cut off is unknown information in the memory system 1, but according to the memory controller 200 according to the present embodiment, it is possible to estimate a period during which the power supply is cut off when the power supply is resumed. FIG. 15 is a diagram for explaining estimation of elapsed time in the memory system of FIG. 1. In the example illustrated in FIG. 15, a vertical axis indicates a shift amount [V] indicating the shift amount from an initial set value of the read voltage value, and a horizontal axis indicates an elapsed time [H] from writing. Also, regarding a distribution of the shift amount illustrated in FIG. 15, a solid line indicates an optimum value of the read voltage, a broken line indicates the read voltage value (prediction value/estimation value) predicted/estimated by the memory system 1 according to the present embodiment, and a plot illustrates an optimum value (observation value) of the acquired (observed) read voltage. Here, the optimum value of the read voltage indicated by the solid line in FIG. 15 is a value acquired at each time point when observation is performed at each time point, and is an unknown value in the memory system 1 when no observation is performed. In the example illustrated in FIG. 15, it is assumed that the power supply is cut off during the period indicated by the arrow, and an actual elapsed time is T. When the prediction value matches the observation value, the memory controller 200 estimates an elapsed time T' since the power supply is cut off based on the number of times management information is updated (predicted number) and a management information update interval defined in the background processing.

As described above, the memory system 1 according to the present embodiment repeats the management information update processing when the power supply is resumed. According to this configuration, even if the power supply is cut off, it is possible to maintain the followability to the time variation of the threshold voltage or the prediction/estimation accuracy. In addition, it is possible to estimate a period during which the power supply is cut off.

Eighth Embodiment

In the seventh embodiment, the example of the processing when the power supply is cut off has been described, but depending on the prediction value (estimation value) of the management information updated immediately before the power supply is cut off, the difference between the prediction value and the observation value may increase each time the prediction is repeated. Therefore, in the background processing according to the present embodiment, when power supply is resumed, management information update (estimation) processing that involves acquisition of the observation values is executed. In other words, the memory system 1 according to the present embodiment operates in the same manner as the case in which the prediction failure is detected when the supply of power is resumed. According to this configuration, it is possible to improve the followability to the time variation of the threshold voltage or the prediction/estimation accuracy when the power supply is cut off, as compared with the seventh embodiment. In addition, it is possible to improve the estimation accuracy during the period when the power supply is cut off.

Ninth Embodiment

In the first embodiment, the case where the state equation represented by Equations (1) and (2) is used in the management information update processing has been described as an example, but the present invention is not limited thereto. In the management information update processing, an attenuation of the time change amount of the optimum read voltage (threshold voltage) may be further considered.

Figure 16:
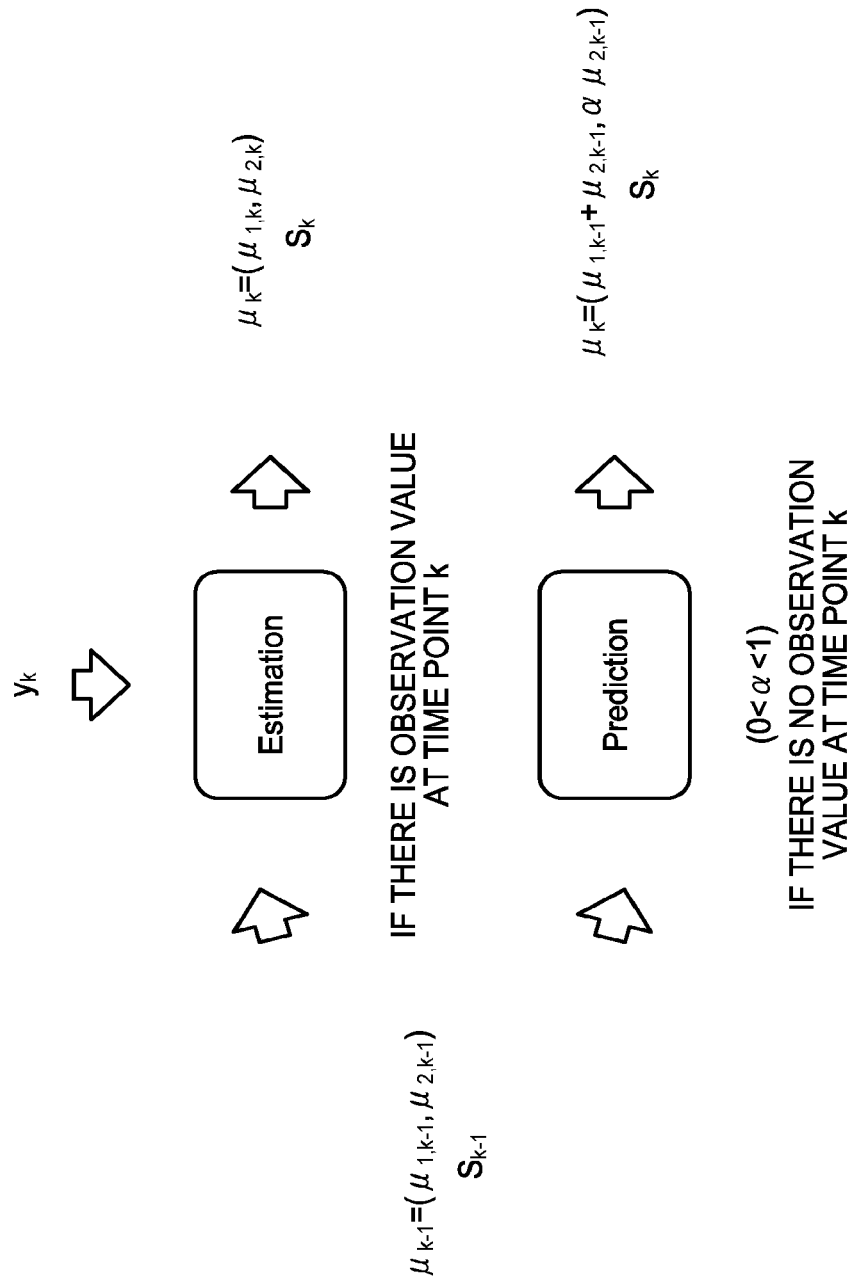
FIG. 16 is a diagram for explaining an outline of another example of the management information update processing in the memory system of FIG. 1.

FIG. 16 is a diagram for explaining an outline of another example of the management information update processing in the memory system of FIG. 1. In the present embodiment, as illustrated in FIG. 16, a parameter α is introduced as a coefficient of a time change amount $\mu_{2,k}$ of the true read voltage at the time point k.

Here, it is assumed that the parameter α is a value satisfying 0<α≤1. In the above-described embodiment, the case where α=1 is described. For this reason, a case where the parameter α is a value satisfying 0<α<1 will be described below as an example. The parameter α satisfying α<1 represents a tendency that an absolute value of a slope is attenuated as time passes. Note that the value of the parameter α may be set as appropriate within a range satisfying 0<α≤1. As an example, the value of the parameter α is fixed until the management information is discarded. As another example, the value of the parameter α is changed according to the exhaustion state of the memory cell and the quality of the memory cell.

At this time, it is assumed that the state equations (Equation (1) and Equation (2)) according to the first embodiment are expressed by being expanded to the following Equations (5) and (6), respectively.

$$\begin{pmatrix} \mu_{1,k} \\ \mu_{2,k} \end{pmatrix} = \begin{pmatrix} 1 & 1 \\ 0 & \alpha \end{pmatrix} \begin{pmatrix} \mu_{1,k-1} \\ \mu_{2,k-1} \end{pmatrix} + \begin{pmatrix} v_{1,k-1} \\ v_{2,k-1} \end{pmatrix} \quad (5)$$

$$\mu_k = T\mu_{k-1} + v_{k-1} \quad (6)$$

$$T = \begin{pmatrix} 1 & 1 \\ 0 & \alpha \end{pmatrix}, \mu_k = (\mu_{1,k}, \mu_{2,k})^t, v_k = (v_{1,k}, v_{2,k})^t$$

Figure 17:
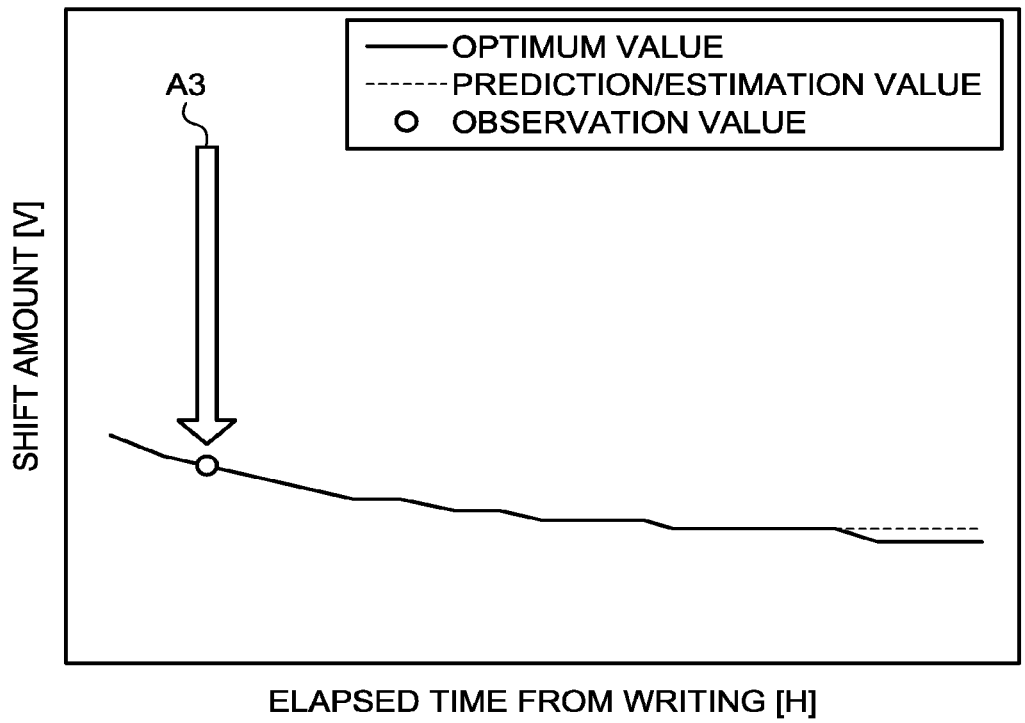
FIG. 17 is a diagram for explaining an outline of the management information update processing of FIG. 16.

FIG. 17 is a diagram for explaining an outline of the management information update processing of FIG. 16. In the example illustrated in FIG. 17, a vertical axis indicates a shift amount [V] indicating the shift amount from an initial set value of the read voltage value, and a horizontal axis indicates an elapsed time [H] from writing. Also, regarding a distribution of the shift amount illustrated in FIG. 17, a solid line indicates an optimum value of the read voltage, a broken line indicates the read voltage value (prediction value/estimation value) predicted/estimated by the memory system 1 according to the present embodiment, and a plot illustrates an optimum value (observation value) of the acquired (observed) read voltage. Here, the optimum value of the read voltage indicated by the solid line in FIG. 17 is a value acquired at each time point when observation is performed at each time point, and is an unknown value in the memory system 1 when no observation is performed. In the example illustrated in FIG. 17, 0.8 is set as the value of the parameter α. It is assumed that acquisition (observation) of the optimum read voltage is performed at the time point indicated by an arrow A3 in FIG. 17. In the background processing, the memory controller 200 estimates management information using the observation value at the time point A3, and stores the estimated management information. Thereafter, the management information is continuously predicted (updated) until a prediction failure is detected.

Thus, in the management information update processing according to the present embodiment, the state equation into which the parameter α is introduced is used. According to this configuration, since the attenuation of the time change amount of the optimum read voltage (threshold voltage) is taken into consideration, it is possible to improve the followability to the time variation of the threshold voltage or the prediction/estimation accuracy compared to the first embodiment. Further, according to this configuration, as illustrated in FIG. 17, it is possible to reduce the frequency of acquisition of the observation value.

Figure 18:
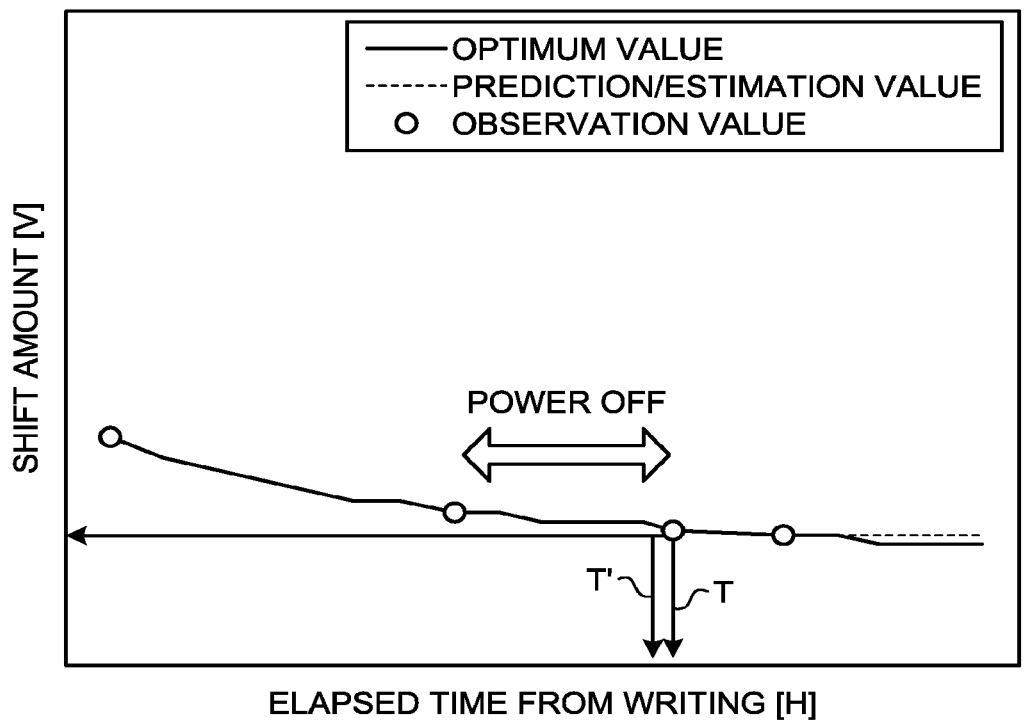
FIG. 18 is a diagram for explaining estimation of an elapsed time using the management information update processing of FIG. 16.

Here, an estimation of an elapsed time when the power supply in the memory system 1 according to the present embodiment is resumed will be described. FIG. 18 is a diagram for explaining another example of estimation of elapsed time in the memory system 1 of FIG. 1. In the example illustrated in FIG. 18, a vertical axis indicates a shift amount [V] indicating the shift amount from an initial set value of the read voltage value, and a horizontal axis indicates an elapsed time [H] from writing. Also, regarding a distribution of the shift amount illustrated in FIG. 18, a solid line indicates an optimum value of the read voltage, a broken line indicates the read voltage value (prediction value/estimation value) predicted/estimated by the memory system 1 according to the present embodiment, and a plot illustrates an optimum value (observation value) of the acquired (observed) read voltage. Here, the optimum value of the read voltage indicated by the solid line in FIG. 18 is a value acquired at each time point when observation is performed at each time point, and is an unknown value in the memory system 1 when no observation is performed. According to the management information update processing according to the present embodiment, an estimation accuracy of the elapsed time can be improved as illustrated in FIG. 18. Further, according to the management information update processing according to the present embodiment, since the followability to the time variation of the threshold voltage or the prediction accuracy is high as compared with the first embodiment, the estimation accuracy of the elapsed time can be improved as compared with the management information update processing according to the seventh embodiment, for example, and the frequency of acquisition of the observation value can be reduced as compared with the management information update processing according to the eighth embodiment, for example.

Note that the techniques according to the above-described embodiments can be arbitrarily combined.

According to at least one of the embodiments described above, since the management information is updated without using the observation value at the current time point, it is possible to maintain the followability of the read voltage with respect to the change in the threshold voltage while reducing the observation frequency. In other words, according to at least one embodiment described above, it is possible to improve the followability of the read voltage with respect to the change in the threshold voltage without increasing the observation frequency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a plurality of memory cells; and
a memory controller configured to update a set value of a read voltage for the plurality of memory cells at a plurality of time points;
wherein the memory controller is configured to execute a first operation of observing an optimum value of the read voltage and updating the set value based on the observation result of the optimum value, at a predetermined time point of the plurality of time points, and
execute a second operation of updating the set value based on the set value updated at one previous time point without executing the observation of the optimum value, at a time point after one time point of the predetermined time point of the plurality of time points.

2. The memory system according to claim 1, wherein the memory controller is configured to execute one of the first operation and the second operation at each of the plurality of time points.

3. The memory system according to claim 1, wherein the memory controller is configured to
execute a third operation of calculating a prediction value of the set value at a first time point based on the set value updated at a second time point, which is one previous time point of the first time point of the plurality of time points and obtaining a prediction accuracy based on the prediction value, at the first time points of the plurality of time points,
execute the first operation based on the prediction value and the observation result of the optimum value when the prediction accuracy is low, and
execute the second operation based on the prediction value when the prediction accuracy is high.

4. The memory system according to claim 3, wherein in the third operation, the memory controller is configured to execute read and error correction on the plurality of memory cells using the obtained prediction value, and determine that the prediction accuracy is low when the error correction fails.

5. The memory system according to claim 4, wherein the memory controller is configured to determine that the prediction accuracy is low when the error correction is successful and the number of corrected errors is greater than a predetermined threshold.

6. The memory system according to claim 4, wherein the memory controller is configured to determine that the prediction accuracy is low when the error correction is successful and a deviation between the number of data corrected from 0 to 1 and the number of data corrected from 1 to 0 is greater than a predetermined threshold.

7. The memory system according to claim 3, wherein the memory controller is configured to determine that the prediction accuracy is low when a variance of the prediction values is greater than a predetermined threshold.

8. The memory system according to claim 1, wherein the memory controller is configured to execute the first operation when power supply to the memory system is resumed.

9. The memory system according to claim 1, wherein the memory controller is configured to acquire the optimum value when power supply to the memory system is resumed, and repeat the second operation until the updated set value becomes a value within a predetermined range according to the optimum value.

10. The memory system according to claim 9, wherein the memory controller is configured to estimate an elapsed time since the power supply to the memory system is cut off based on the number of updates of the set value after the power supply to the memory system is resumed.

11. The memory system according to claim 1, wherein the memory controller is configured to execute the first operation at a time point until a predetermined time elapses from data writing to the memory cell among the plurality of time points.

12. The memory system according to claim 1, wherein the memory controller is configured to update a value of a change amount of the set value in the first operation at each time point of the plurality of time points.

13. The memory system according to claim 12, wherein an absolute value of the change amount decreases whenever the change amount is updated.

14. The memory system according to claim 1, wherein the memory controller is configured to hold at least one set value and at least one value of a change amount of the set value at each of the plurality of time points.

15. The memory system according to claim 14, wherein the memory controller is configured to hold a variance value of the prediction value of the set value at each of the plurality of time points.

16. The memory system according to claim 14, wherein at each of the plurality of time points, the at least one set value and the at least one value of the change amount of the set value are held for each block and/or word line including the plurality of memory cells.

17. The memory system according to claim 1, wherein
each of the plurality of memory cells is capable of storing the n-bit data in accordance with $2^n$ threshold regions (n is a natural number), and
the memory controller is configured to have the set value for each of a plurality of read voltages between adjacent threshold regions of the plurality of threshold regions.

18. The memory system according to claim 1, wherein the plurality of time points have a predetermined interval.

19. The memory system according to claim 1, wherein the memory controller is configured to measure an elapsed time from data writing to the memory cell at each of the plurality of time points.

* * * * *